US012641921B2

(12) United States Patent (10) Patent No.: US 12,641,921 B2
Park et al. (45) Date of Patent: May 26, 2026

(54) METHOD FOR FORMING STRUCTURE COMPRISING QUANTUM DOTS IN SURFACE CONTROL REGION, SURFACE CONTROL SUBSTRATE HAVING STRUCTURE FORMED TO COMPRISE QUANTUM DOTS, AND PHOTOELECTRIC ELEMENT USING SAME

(71) Applicant: KOREA ADVANCED NANO FAB CENTER, Gyeonggi-do (KR)

(72) Inventors: Hyeong Ho Park, Daejeon (KR); Eunjeong Youn, Seoul (KR); Hae-Yong Jeong, Gyeonggi-do (KR); Sang Hyun Jung, Gyeonggi-do (KR); Yu Min Ko, Gyeonggi-do (KR); Chan Soo Shin, Gyeonggi-do (KR); Shin Keun Kim, Gyeonggi-do (KR)

(73) Assignee: KOREA ADVANCED NANO FAB CENTER, Gyeonggi-do (KR)

( * ) Notice: Subject to any disclaimer, the term of this patent is extended or adjusted under 35 U.S.C. 154(b) by 870 days.

(21) Appl. No.: 17/924,052

(22) PCT Filed: Aug. 4, 2021

(86) PCT No.: PCT/KR2021/010231
§ 371 (c)(1),
(2) Date: Nov. 8, 2022

(87) PCT Pub. No.: WO2022/145615
PCT Pub. Date: Jul. 7, 2022

(65) Prior Publication Data
US 2023/0178682 A1 Jun. 8, 2023

(30) Foreign Application Priority Data
Dec. 28, 2020 (KR) ........................ 10-2020-0184234

(51) Int. Cl.
*H10H 20/812* (2025.01)
*H10H 20/01* (2025.01)
*H10H 20/819* (2025.01)

(52) U.S. Cl.
CPC .......... *H10H 20/812* (2025.01); *H10H 20/01* (2025.01); *H10H 20/819* (2025.01)

(58) Field of Classification Search
CPC .... H10H 20/812; H10H 20/01; H10H 20/819; H10H 20/0361; H10H 20/8512;
(Continued)

(56) References Cited

U.S. PATENT DOCUMENTS

2006/0115917 A1* 6/2006 Linden .................... H01S 5/341
                                                                        438/46
2017/0018690 A1   1/2017 Werner et al.
                        (Continued)

FOREIGN PATENT DOCUMENTS

KR     20170011252 A    2/2017
KR     20170044052 A    4/2017
KR     20200115745 A    10/2020

OTHER PUBLICATIONS

International Search Report, International Application No. PCT/KR2021/010231, mailed on Oct. 27, 2021.

*Primary Examiner* — Seung C Sohn
(74) *Attorney, Agent, or Firm* — MARSHALL, GERSTEIN & BORUN LLP

(57) ABSTRACT

A structure including quantum dots formed in a surface control region, a method of forming a structure including quantum dots in a surface control region, a surface-controlled substrate provided with the structure including quantum dots, and a photoelectronic element using the same. The method includes forming multiple surface control layers that differ in etch resistance on a substrate, securing a surface control region on the substrate by forming control patterns
(Continued)

selective irradiation having respectively different sizes in the respective surface control layers depending on the etch resistance values through an exposure process, forming the structure including quantum dots in the surface control region by using the plurality of surface control layers as masks, and removing the surface control layers.

10 Claims, 25 Drawing Sheets

(58) Field of Classification Search
CPC .. H10H 20/8514; H10H 20/84; H10H 20/811; H10F 77/1433; H10F 30/225; H10F 71/00; H10F 77/12; H10F 77/143
See application file for complete search history.

(56) References Cited

U.S. PATENT DOCUMENTS

| | | | |
|---|---|---|---|
| 2018/0102085 A1 | 4/2018 | Pan | |
| 2020/0105994 A1* | 4/2020 | Leipold | H10D 48/3835 |

* cited by examiner

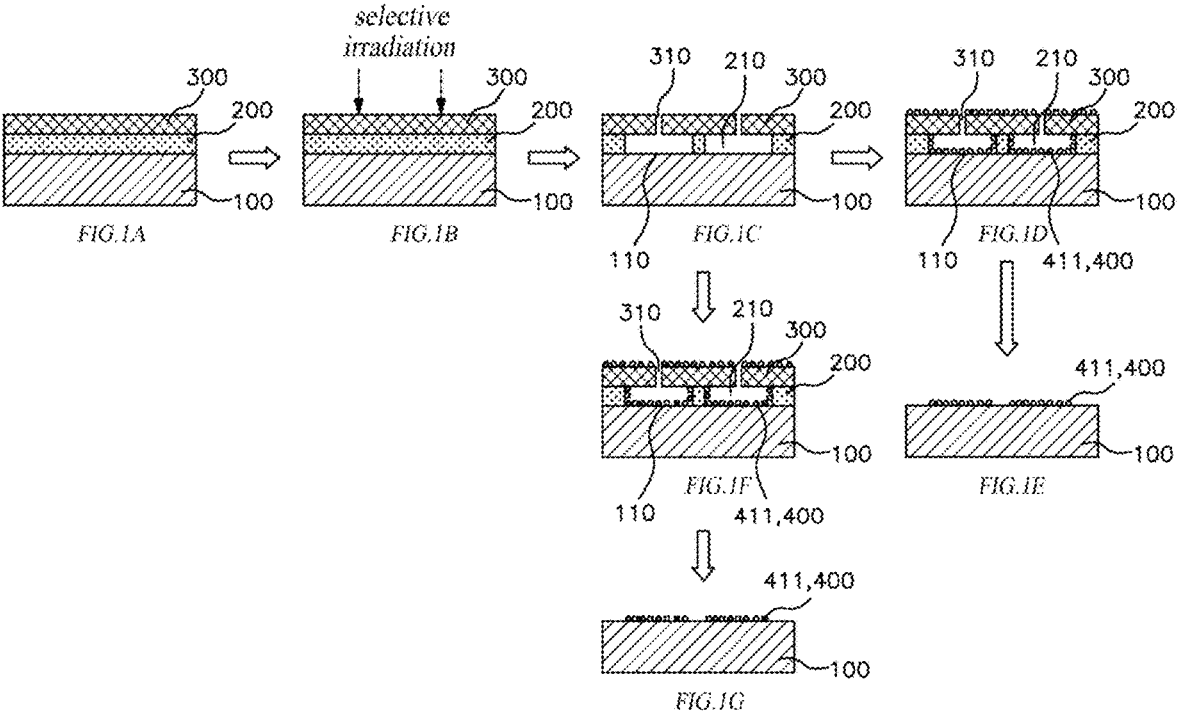
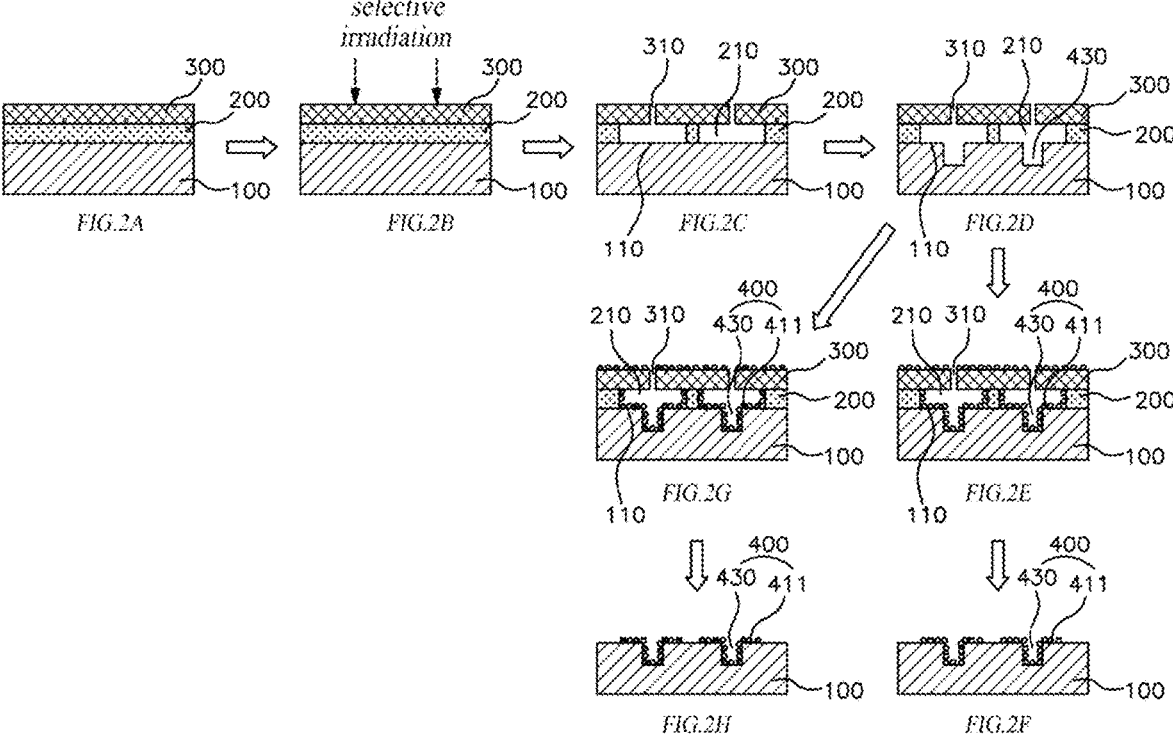

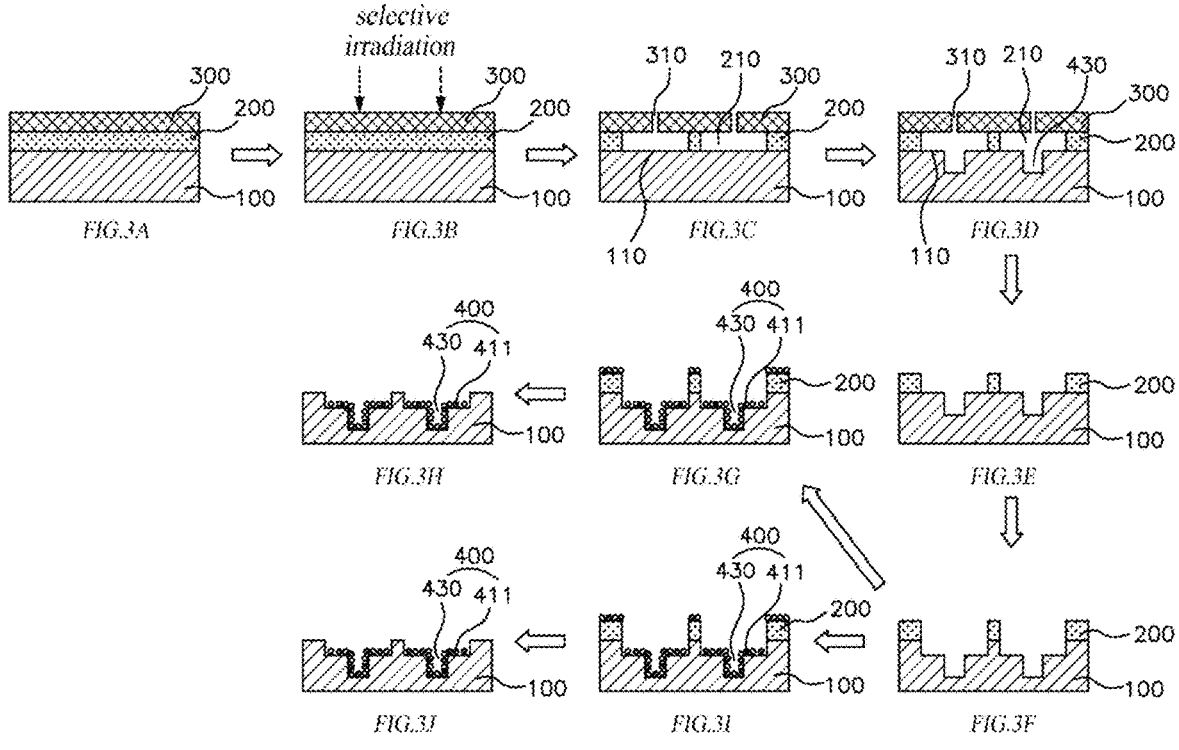
FIG.3A FIG.3B FIG.3C FIG.3D
FIG.3H FIG.3G FIG.3E
FIG.3J FIG.3I FIG.3F
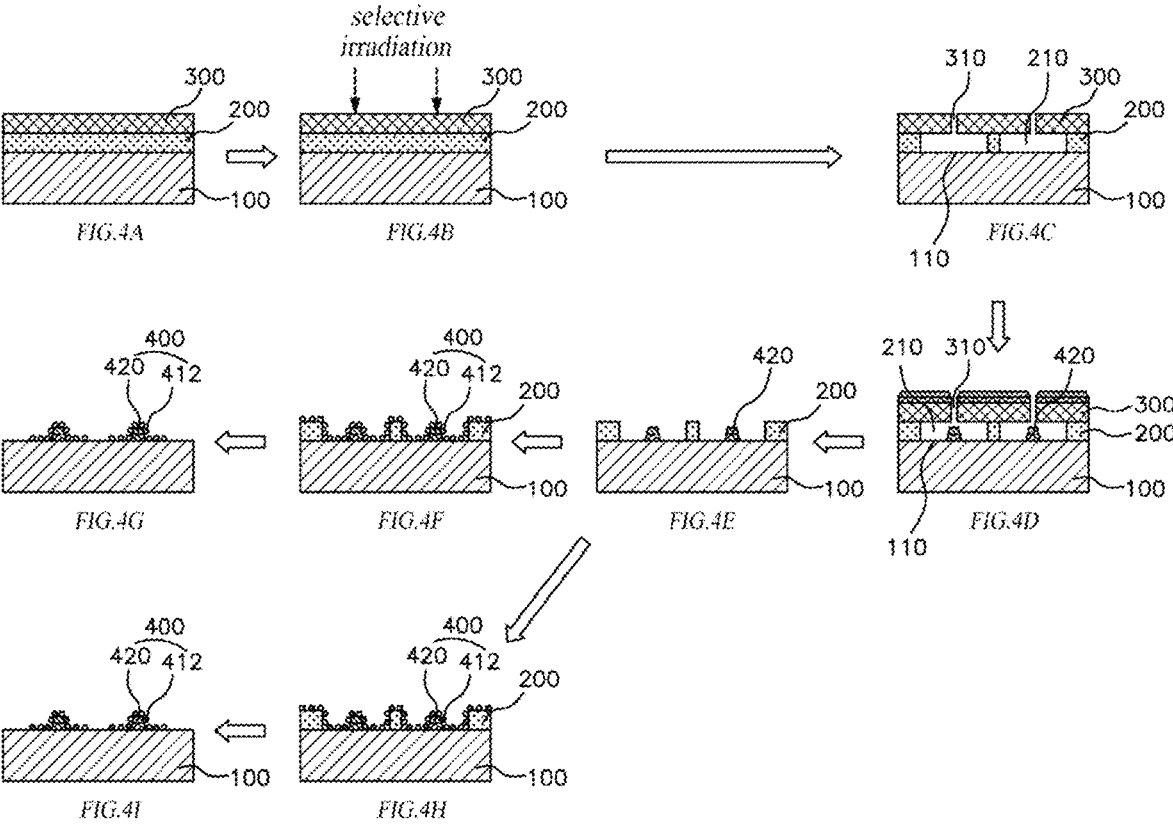
FIG.4A FIG.4B FIG.4C
FIG.4G FIG.4F FIG.4E FIG.4D
FIG.4I FIG.4H

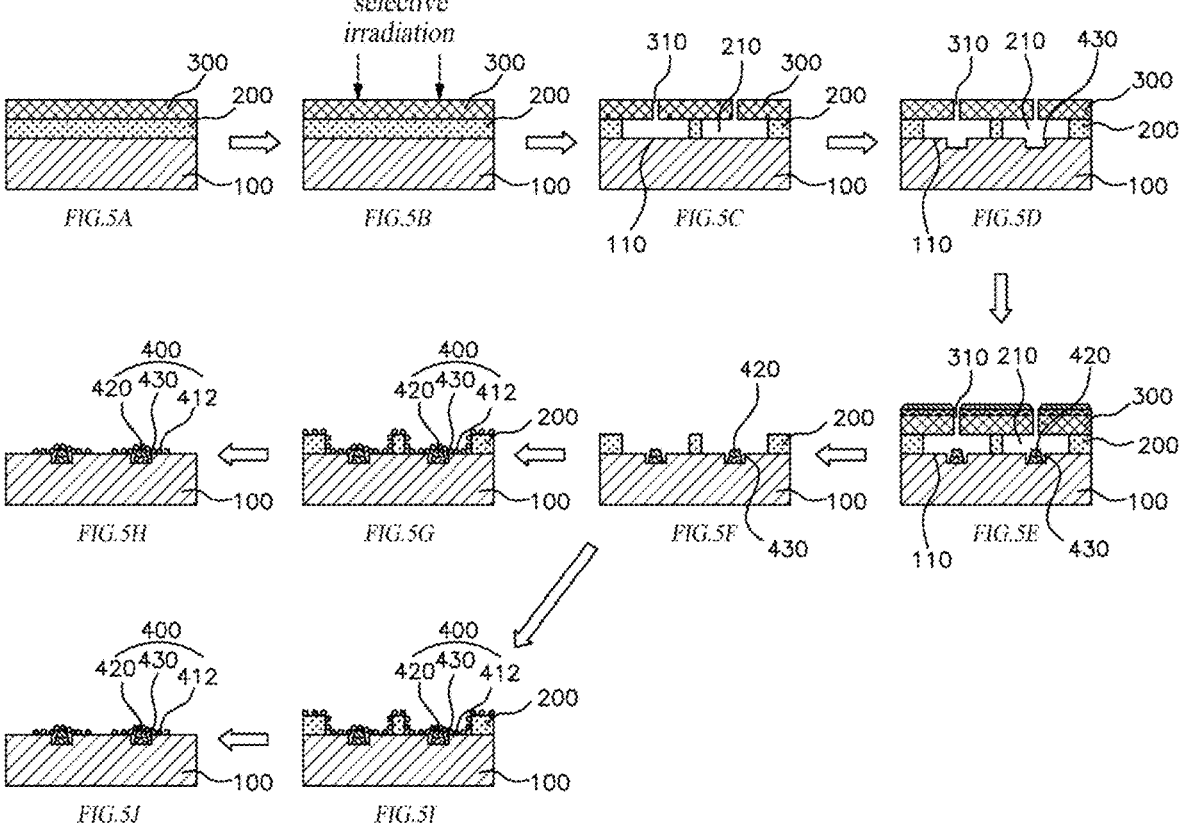

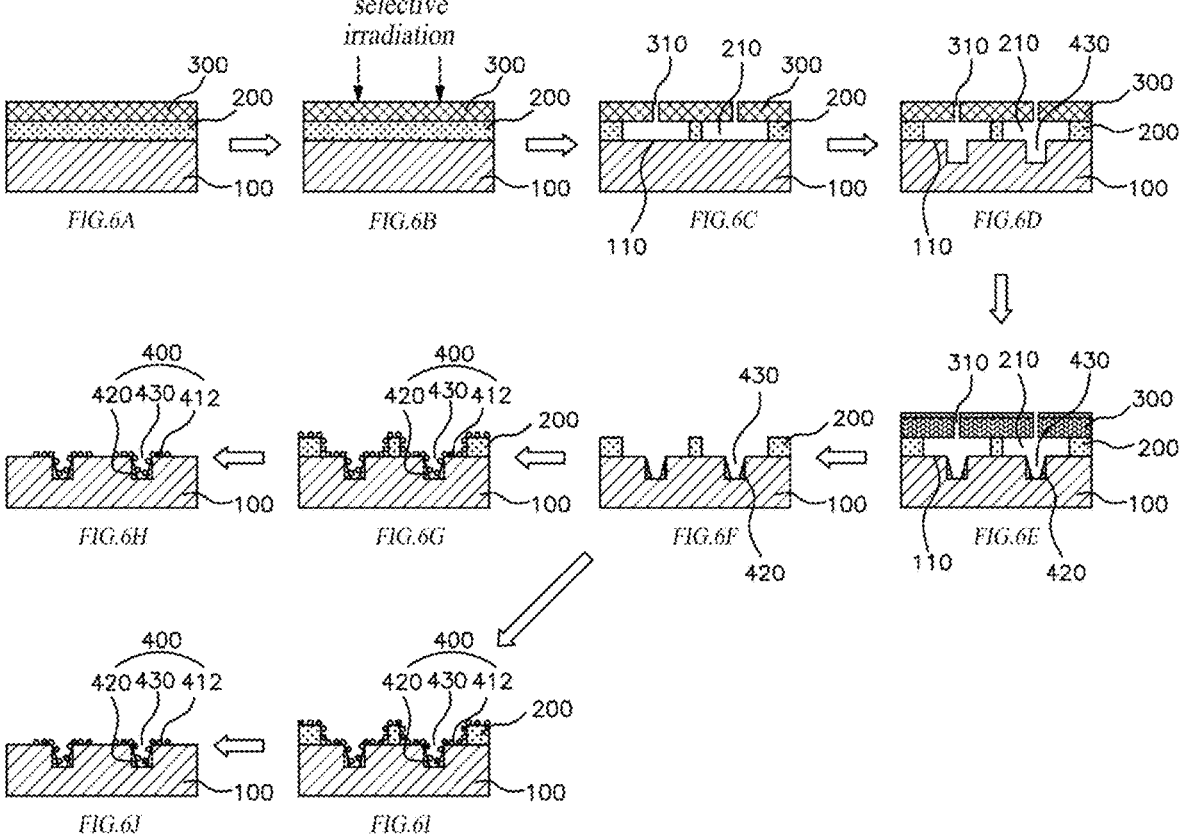

FIG. 9C

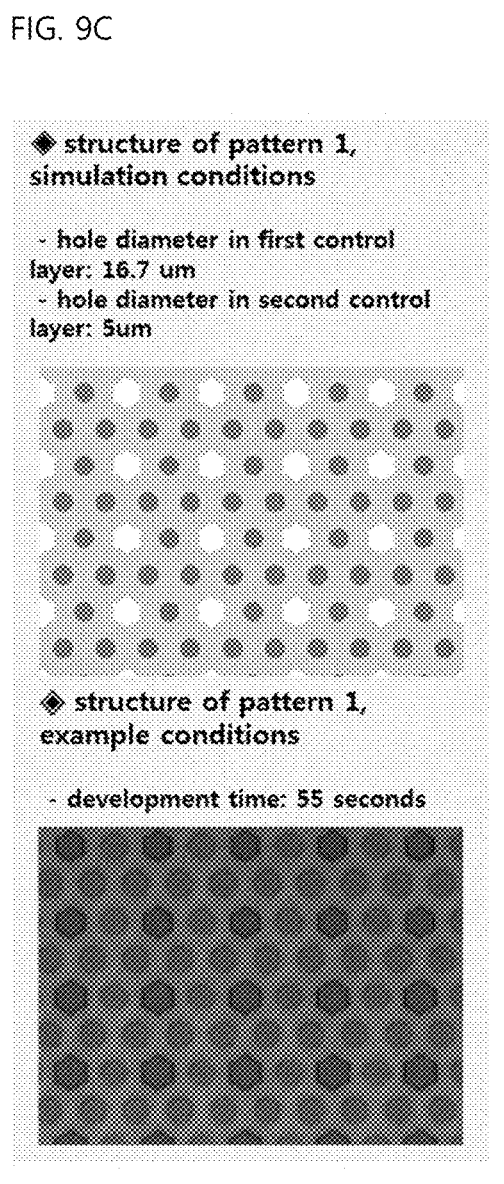

◆ structure of pattern 1,
simulation conditions

- hole diameter in first control
layer: 16.7 um
- hole diameter in second control
layer: 5um ◆ structure of pattern 1,
example conditions

- development time: 55 seconds

FIG. 9D

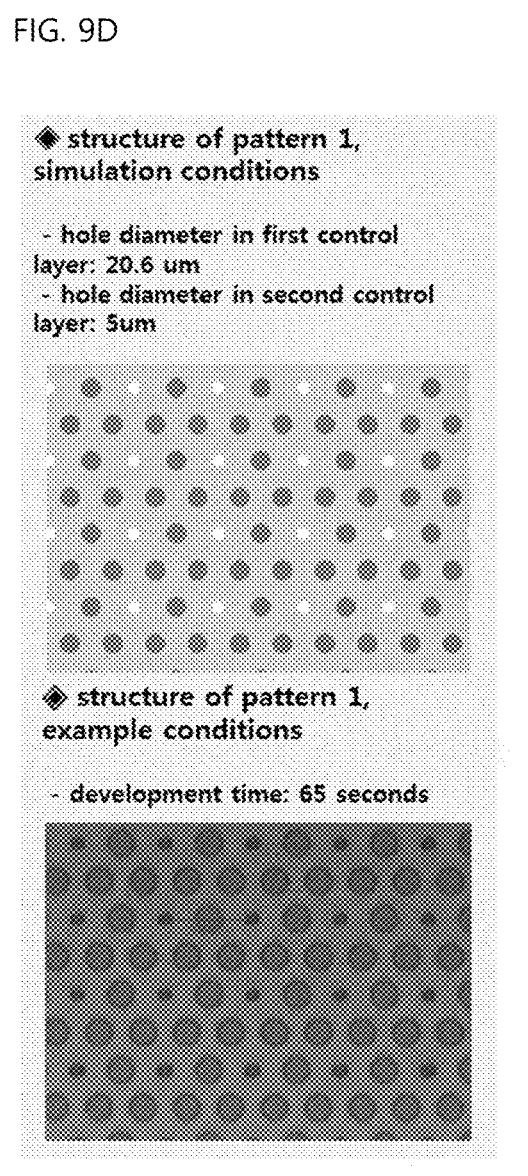

◆ structure of pattern 1,
simulation conditions

- hole diameter in first control
layer: 20.6 um
- hole diameter in second control
layer: 5um ◆ structure of pattern 1,
example conditions

- development time: 65 seconds

FIG. 9F

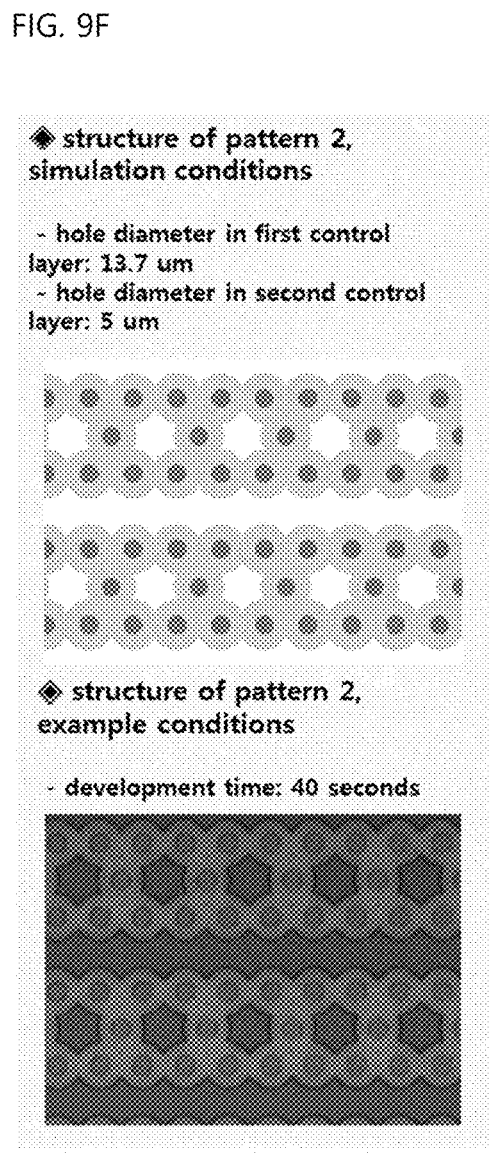

◆ structure of pattern 2,
simulation conditions

- hole diameter in first control
layer: 13.7 um
- hole diameter in second control
layer: 5 um ◆ structure of pattern 2,
example conditions

- development time: 40 seconds

FIG. 9G

FIG. 10C
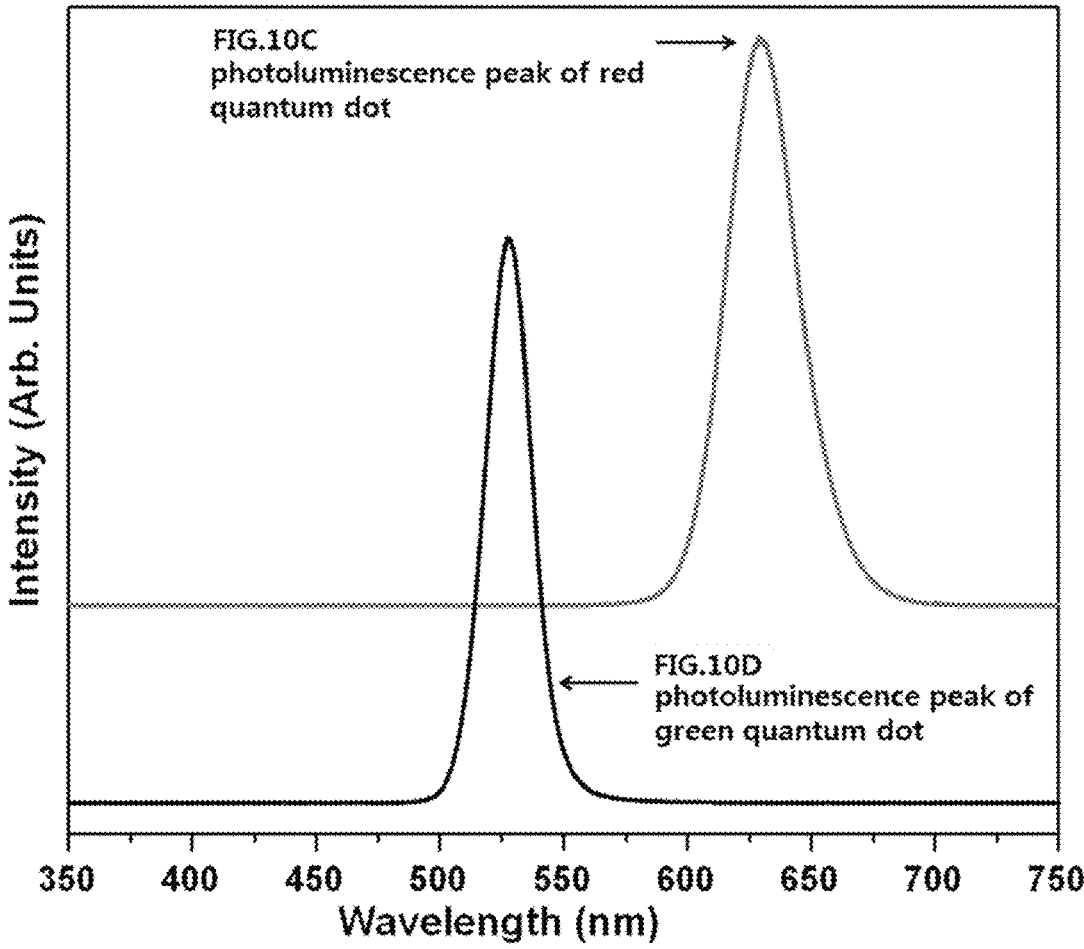
FIG.10C
photoluminescence peak of red
quantum dot
FIG.10D
photoluminescence peak of
green quantum dot
FIG. 11A
pattern formed from green
quantum dot ink (concentration A)
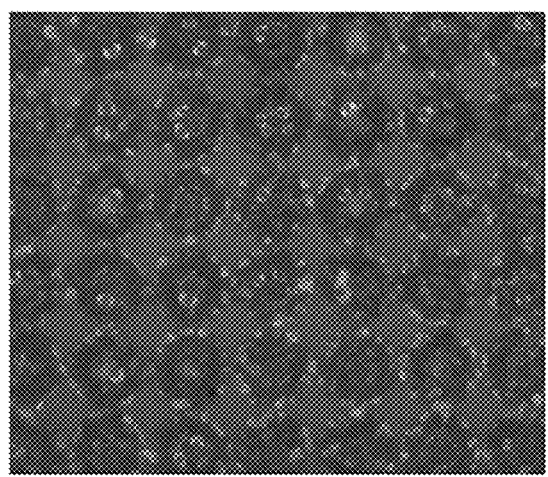

pattern formed from green
quantum dot ink (concentration B)

pattern formed from green
quantum dot ink (concentration C)

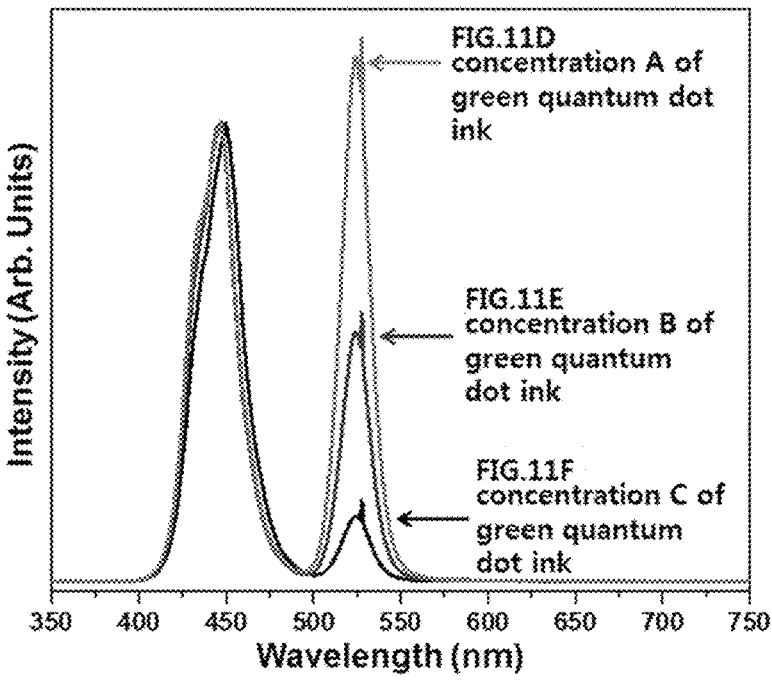
FIG. 11G
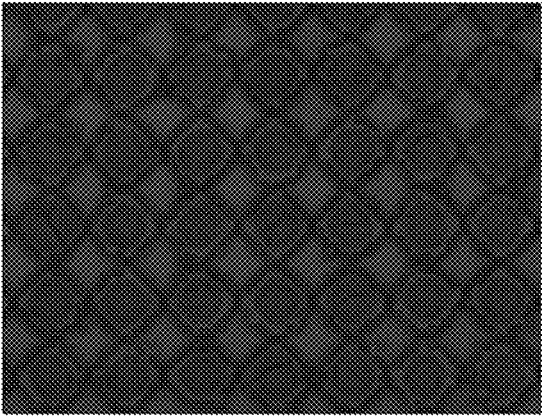
pattern formed by dispensing red
quantum dot ink (condition A)

pattern formed by spin-coating red
quantum dot ink (condition A)

pattern formed by spin-coating red
quantum dot ink (condition A)

quantum dot nanocomposite structure formed by
mixing green quantum dot ink and red quantum dot
ink in wt.% ratio of 1:9 and dispensing mixed ink once.

quantum dot nanocomposite structure formed by
mixing green quantum dot ink and red quantum dot
ink in wt.% ratio of 4:6 and dispensing mixed ink once.

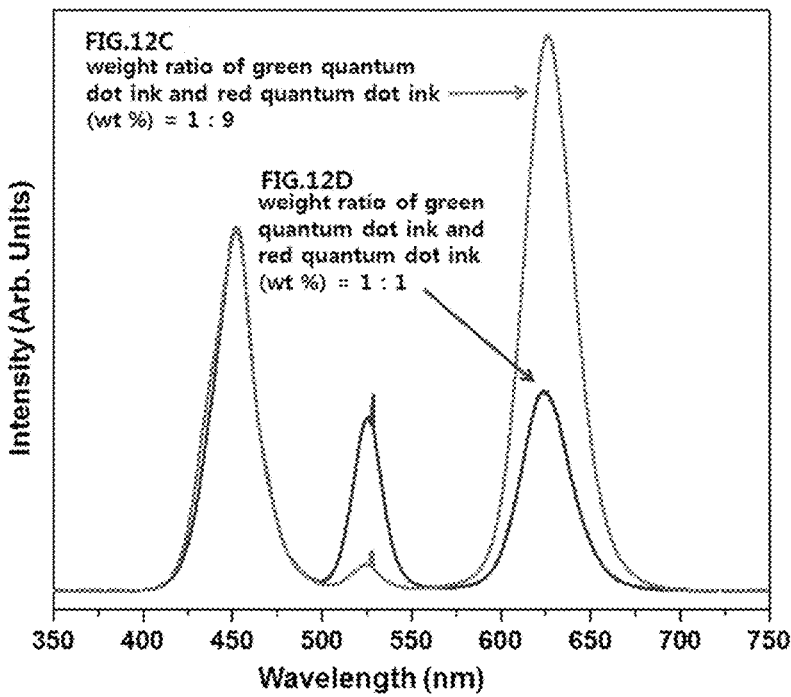

FIG.12C
weight ratio of green quantum
dot ink and red quantum dot ink ⟶
(wt %) = 1 : 9

FIG.12D
weight ratio of green
quantum dot ink and
red quantum dot ink
(wt %) = 1 : 1

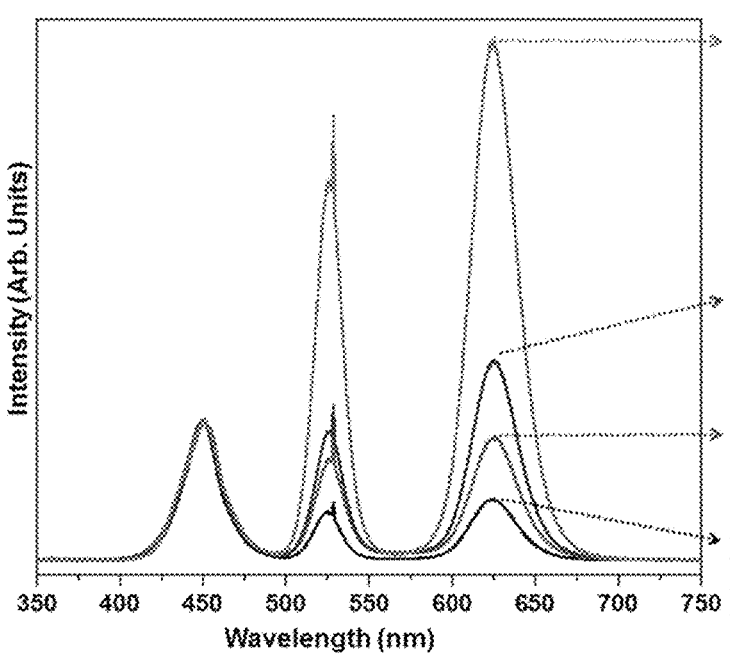

FIG.12G
quantum dot nanocomposite structure
formed by mixing green quantum dot ink
and red quantum dot ink in wt.% ratio of 4:6
and dispensing mixed ink once.

FIG.12F
quantum dot nanocomposite structure
formed by mixing green quantum dot ink
and red quantum dot ink in wt.% ratio of 4:6
and dispensing mixed ink twice.

FIG.12E
quantum dot nanocomposite structure
formed by mixing green quantum dot ink
and red quantum dot ink in wt.% ratio of 4:6
and dispensing mixed ink four times.

FIG.12H
quantum dot nanocomposite structure
formed by mixing green quantum dot ink
and red quantum dot ink in wt.% ratio of 4:6
and spin-coating with mixed ink once

METHOD FOR FORMING STRUCTURE COMPRISING QUANTUM DOTS IN SURFACE CONTROL REGION, SURFACE CONTROL SUBSTRATE HAVING STRUCTURE FORMED TO COMPRISE QUANTUM DOTS, AND PHOTOELECTRIC ELEMENT USING SAME

TECHNICAL FIELD

The present invention relates to a method of forming a structure including quantum dots in a surface control region of a substrate, the method forming the structure including quantum dots in the surface control region of the substrate, thereby easily controlling the quantity of quantum dots in a specific region of the substrate. In addition, the present invention relates to a surface-controlled substrate provided with a structure including quantum dots and to a photoelectric element including the same.

Five national projects supported by the Korean government associated with this invention are described below.

Project Unique Number: 2410010677
  Project Serial Number: RS-2023-00257784
  Government Department: MOTIE (Ministry of Trade, Industry and Energy)
  Specialized Institution for Project Management: KEIT (Korea Planning & Evaluation of Industrial Technology)
  Title of Research Business: High performance business of nano infrastructure process service
  Title of Project: "Development of Process Technology for Nanomaterials and Components in Semiconductor and Display"
  Contribution Rate: 1/5
  Supervising Institute: Korea Electronics Technology Institute
  Research Period: Jan. 1, 2026~Dec. 31, 2026
Project Unique Number: 2410010013
  Project Serial Number: RS-2024-00417436
  Government Department: MOTIE (Ministry of Trade, Industry and Energy)
  Specialized Institution for Project Management: KEIT (Korea Planning & Evaluation of Industrial Technology)
  Title of Research Business: The 1st Electronic Component Industrial Technology Development in 2024
  Title of Project: "Development of flip-structured microLED chip technology with an external quantum efficiency of more than 50% and a chip size of less than 800 μm2"
  Contribution Rate: 1/5
  Supervising Institute: WaveLord Inc.
  Research Period: Jan. 1, 2026~Dec. 31, 2026
Project Unique Number: 2410011729
  Project Serial Number: RS-2025-02633001
  Government Department: MOTIE (Ministry of Trade, Industry and Energy)
  Specialized Institution for Project Management: KEIT (Korea Planning & Evaluation of Industrial Technology)
  Title of Research Business: Electronic Component Industrial Technology Development in 2025 (Industrial Strategic Technology Development Program)
  Title of Project: "Development of a Standard Platform Technology for 1× μm Blue/Green Micro-LED Pixels to Enable Mass Production and Supply Chain Establishment"

Contribution Rate: 1/5
  Supervising Institute: Seoul Semiconductor Co., Ltd.
  Research Period: Jan. 1, 2026~Dec. 31, 2026
Project Unique Number: 2410011728
  Project Serial Number: RS-2025-02633104
  Government Department: MOTIE (Ministry of Trade, Industry and Energy)
  Specialized Institution for Project Management: KEIT (Korea Planning & Evaluation of Industrial Technology)
  Title of Research Business: Electronic Component Industrial Technology Development in 2025 (Industrial Strategic Technology Development Program)
  Title of Project: "Development of 1× μm size RGB Micro-LED and CoW for smart watch"
  Contribution Rate: 1/5
  Supervising Institute: Seoul Semiconductor Co., Ltd.
  Research Period: Jan. 1, 2026~Dec. 31, 2026
Project Unique Number: 2410011751
  Project Serial Number: RS-2025-02310442
  Government Department: MOTIE (Ministry of Trade, Industry and Energy)
  Specialized Institution for Project Management: KEIT (Korea Planning & Evaluation of Industrial Technology)
  Title of Research Business: Electronic Component Industrial Technology Development in 2025 (Industrial Strategic Technology Development Program)
  Title of Project: "Development of nitride-based red microLED chip having over 15% external quantum efficiency with size of 10 μm or less and manufacturing technology"
  Contribution Rate: 1/5
  Supervising Institute: MEMS Corp.
  Research Period: Jan. 1, 2026~Dec. 31, 2026

BACKGROUND

A photoelectronic element is a device that converts light energy into electrical energy. Examples of the photoelectronic element include light emitting diodes (LEDs), micro-LEDs, solar cells, laser diodes (LDs), photodiodes (PDs), and avalanche photo diodes (APDs).

These photoelectronic elements have found applications in a variety of electrical or electronic products. With the trend toward high performance and miniaturization of electrical and electronic products, research has focused on performance improvement for increased integration and high efficiency of photoelectronic devices.

Recently, attempts have been made to increase the surface area of a photoelectronic element to form nano- or micro-structures suitable for high efficiency.

Among these photoelectronic elements, light-emitting diodes (LEDs) are advantages in long lifespan, reduced power consumption, and low maintenance costs. Therefore, the LEDs have applications in various fields such as display devices, semiconductor devices, solar cells, lighting devices, bio-industry, optical communications, and photosensors. For improvement in integration and efficiency, various methods are attempted by researchers.

Generally, a light-emitting diode (LED) includes an n-type semiconductor layer, an active layer, and a p-type semiconductor layer. When a current flows forward through the n-type semiconductor layer and the p-type semiconductor layer, electrons and holes injected into the active layer recombine to generate light.

While the efficiency (i.e., luminance efficiency) of an LED is determined by the internal quantum efficiency and the light extraction efficiency (external quantum efficiency). Unlike the internal quantum efficiency, the light extraction efficiency is significantly reduced due to scattering or total reflection in the internal structure of an LED, thereby lowering the overall luminance efficiency of the LED.

That is, for improvement in the light extraction efficiency, it is required to modify the internal structure of an LED. Such modification is achieved by roughening the surface of the top layer, which is an n-type semiconductor layer or a p-type semiconductor layer, of an LED.

Conventionally, a wet etching process is mainly used for the surface roughening. In this case, however, the distribution and shape of the ruggedness are uneven, resulting in light scattering or light reflection. Therefore, the light extraction efficiency is reduced, and it is difficult to produce products uniform in light extraction efficiency.

In addition, when light is emitted from the active layer, light reflection or scattering occurs due to the difference in refractive index between the semiconductor layer and the air. This also reduces the light extraction efficiency.

An attempt to add a dry etching process or an imprinting process to the wet etching process has been made to impart directionality to the rugged pattern and to form a more uniform rugged pattern. However, this method has still room for improvement in terms of increasing the light extraction efficiency.

On the other hand, micro light-emitting diodes (micro-LEDs) having sizes ranging from a few μm to a few tens of μm have recently been used in various applications. Due to the fact that the efficiency of LEDs decreases dramatically as the size of chips decreases, a high output power with maximized light extraction efficiency is required for all of the blue, green, and red micro-LEDs.

For example, the luminous efficiency of a micro-LED light source having a size of $50 \times 50 \ \mu m^2$ is dramatically reduced to 30% or lower for the same area compared to the luminous efficiency of a micro-LED light source having a size of $1,000 \times 1,000 \ \mu m^2$. In the case of a micro-LED chip having a size of 100 μm or less, the area of the sidewall is dramatically increased compared to the existing LED chip. Therefore, structure improvement is inevitably required to maximize the light extraction efficiency of micro-LEDs.

On the other hand, a quantum dot emits light corresponding to the bandgap energy of the quantum dot when photons excited by external light are stabilized, and the wavelength of the emitted light varies depending on the size of the quantum dot, and thus various colors can be displayed.

The quantum dots are excellent in color reproduction, quantum efficiency, and photostability. For this reason, the quantum dots are considered as a material that can compensate for the disadvantages of LEDs. The quantum dots are applicable to various photoelectronic elements, and all colors can be expressed according to particle sizes.

To achieve color reproduction, a selective patterning process for formation of patterning quantum dots with various sizes is used. Conventionally, there was an attempt to form selectively patterned quantum dots with various sizes by using colloidal quantum dots.

The colloidal quantum dots produced by the existing solution process have a disadvantage in that it is difficult to form quantum dots with different sizes through selective patterning. The quantum dot patterning based on mist fabrication is a technique of patterning through a shadow mask at room temperature and atmospheric pressure by using a spraying method using liquid precursors. However, this technique has a problem in that it is difficult to achieve quality color reproduction because the sizes of the patterns that can be formed by the technique are hundreds of micrometers or larger.

On the other hand, an ink jet printing method has an advantage of forming patterns over a large area but has a disadvantage in that it is difficult to form micropatterns due to blemishes caused by the coffee ring effect that occurs when the dropped quantum dot solution evaporates.

On the other hand, an existing quantum dot patterning method to improve the light extraction efficiency and conversion efficiency is disadvantageous in that pattern control is not easy, and control of the quantity of the quantum dots is not easy. Therefore, study to find a new method is required.

SUMMARY

Technical Problem

The present invention has been made to solve the problems occurring in the related art, and an objective of the present invention is to provide a method of forming a structure including quantum dots in a surface control region of a substrate, the method being capable of easily controlling the quantity of quantum dots in a specific region of an upper surface of the substrate by forming the structure including quantum dots in the surface control region. In addition, an objective of the present invention is to provide a surface-controlled substrate provided with a quantum dot structure formed by the method described above. In addition, an objective of the present invention is to provide a photoelectronic element using the surface-controlled substrate.

Technical Solution

In order to accomplish the objective, according to the present invention, there is provided a method of forming a structure including quantum dots in a surface control region, the method including: forming multiple surface control layers that are differ in etch resistance on a substrate; securing a surface control region on the substrate by forming control patterns having respectively different sizes depending on etch resistance of each of the surface control layers through an exposure process, in the multiple surface control layers such that a lower control pattern of the multiple control patterns is formed to have an extension cut compared to an upper control pattern of the multiple control patterns; forming the structure including quantum dots in the surface control region by using the multiple surface control layers as masks; and removing the surface control layers. There is also provided a surface-controlled substrate provided with a structure including quantum dots, the structure being manufactured by the above-described method.

In addition, preferably, the structure including quantum dots may be formed on the substrate by removing all of the surface control layers. Alternatively, a composite quantum structure including different types of quantum dots superimposed on each other may be formed on the substrate by sequentially removing the surface control layer while using the remaining surface control layers as masks.

A method of forming a structure including quantum dots in a surface control region includes: a first step of forming a first surface control layer on a substrate; a second step of forming a second surface control layer on the first surface control layer, the second surface control layer having a relatively high etch resistance to the first surface control layer; a third step of forming a first control pattern in the second surface control layer by an exposure process; a fourth step of forming a second control pattern having an extension cut form in the first surface control layer, continuously or sequentially to the first control pattern of the second surface control layer; a fifth step of securing a surface control region on the substrate by using the second control pattern of the first surface control layer; a sixth step of forming a first quantum dot structure or a thin film structure in the surface control region by using the second surface control layer provided with the first control pattern and the first surface control layer provided with the second control pattern as masks; and a seventh step of forming the first quantum dot structure on the substrate by removing the second surface control layer and the first surface control layer, or forming the second quantum dot structure in the surface control region by removing the second surface control layer while using the first surface control layer provided with the second control pattern as a mask and forming, on the substrate, a composite quantum structure composed of the first quantum dot structure and the second quantum dot structure or composed of the thin film structure and the second quantum dot structure by removing the first control layer provided with the second control pattern.

Preferably, an etch resistance ratio of the first surface control layer and the second surface control layer is in a range of 1:1.1 to 1:10.

In the fourth step, preferably, a development process associated with the exposure process of the third step is performed, and an additional development process is performed continuously or subsequently to the former development process to form the second control pattern.

In the fourth step, preferably, after the development process or the additional development, the first surface control layer is wet etched or dry etched to increase the extension cut so that the second control pattern is formed as an increased extension cut.

It is preferable that arrangement of the second control patterns of the first surface control layer is determined according to arrangement of the first control patterns of the second surface control layer, or it is preferable that a pattern shape is determined according to a distance between the first control patterns of the second surface control layer.

In the fifth step, it is preferable that a size of the surface control region is adjusted by changing an area of the second control pattern that is the extension cut formed in the fourth step.

In addition, preferably, the quantum dots are made of any one material or a combination of two more materials selected from the group consisting of CdS, CdSe, CdTe, ZnS, ZnSe, ZnTe, CuInS2, HgS, HgSe, HgTe, CdSeS, CdSeTe, CdSTe, PbSe, PbS, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, CdZnSeS, CdZnSeTe, CdZnSTe, CdHgSeS, CdHgSeTe, CdHgSTe, HgZnSeS, HgZnSeTe, HgZnSTe, GaN, GaP, GaAs, AlN, AlP, AlAs, InN, InP, InAs, GaNP, GaNAs, GaPAs, AlNP, AlNAs, AlPAS, InNP, InNAs, InPAs, GaAlNP, GaAlNAs, GaAlPAs, GaInNP, GaInNAs, GaIn-PAs, InAlNP, InAlNAs, and InAlPAs.

Preferably, the thin film structure may be formed as a single-layer or multi-layer thin film that has a different surface characteristic from the substrate by using the second surface control layer provided with the first control pattern and the first control layer provided with the second control pattern as masks.

In addition, after the fifth step, it is preferable to form an etched pattern in the surface control region by using the second surface control layer provided with the first control pattern and the first surface control layer provided with the second control pattern as etch masks.

In addition, the first quantum dot structure and the composite quantum dot structure may be formed to correspond to the etched pattern.

In addition, the etched pattern may be formed by a single etching process such as a dry etching process or a wet etching process, or a composite etching process in which a dry etching process and a wet etching process are sequentially performed in this order or in reverse order.

In addition, the thin film structure may be formed to have an inclined surface in the etched pattern.

In addition, it is preferable to protect one or more of the first quantum dot structure, the second quantum dot structure, and the composite quantum dot structure by forming a protective layer after the sixth step or before removing the first surface control layer provided with the second control pattern in the seventh step.

In addition, it is preferable to perform heat treatment after forming the first quantum dot structure, the second quantum dot structure, or the composite quantum dot structure before removing the first surface control layer or the second surface control layer.

The surface control region may undergo adhesion enhancing surface treatment or hydrophobic surface treatment.

The adhesion enhancing surface treatment may be any one or more methods selected from among promoter resin coating, oxygen plasma treatment, ultraviolet-ozone treatment, and microwave treatment that are performed on the substrate, and the hydrophobic surface treatment may be any one or more methods selected from among hydrophobic material coating and plasma treatment that are performed on the surface control region formed of the substrate.

On the other hand, preferably, the substrate may be an n-type semiconductor layer or a p-type semiconductor layer formed as a top layer of a photoelectronic element, and the photoelectronic element may be one or more devices selected from among a light-emitting diode (LED), a micro-emitting diode (micro-LED), a solar cell, a laser diode (LD), a photo diode (PD), and an avalanche photo diode (APD), or may be an array of the selected devices.

Advantageous Effects

The present invention can easily control the quantity of quantum dots and improve the applicability of quantum dots by forming a structure including quantum dots in a surface control region (surface area increasing, surface shape control, surface characteristic control, etc.) of a substrate.

That is, it is possible to easily control the quantity of quantum dots in a specific position by diversely controlling the quantum dot formation method (such as spin-coating, dispensing, dipping, and inkjet printing) in a surface control region, the concentration of quantum dots, and the mixing ratio of two or more types of quantum dots. Therefore, the present invention has an effect of implementing light emission of various colors and an effect of adjusting the intensity of light emission.

In addition, in the present invention, multiple surface control layers are formed on a substrate to increase the precision and freedom degree of surface area control of the substrate. Therefore, according to the present invention, the surface control of the substrate and the control of structures including quantum dots are facilitated, and thus applicability of the structures including quantum dots is improved.

In addition, in the present invention, over-development is performed to form an extension cut in a first surface control layer, so that a surface control region can be easily secured on the substrate. In addition, an etched pattern is formed on the substrate, and a structure including quantum dots are formed thereon. Therefore, surface area increasing and control and surface characteristic control are facilitated.

In addition, in the present invention, structures including quantum dots are formed in surface control regions formed in the top layer of a photoelectronic element. Therefore, the present invention has an effect of providing a photoelectronic element that is maximized in a light extraction efficiency and a light conversion efficiency and which can easily control the intensity of light.

In addition, in the present invention, a composite quantum dot structure may be formed in which a single or multiple layers having a different refractive index from a substrate is formed as a thin film structure, and the composite quantum dot structure is superimposed on the thin film structure. Therefore, it is easy to control the refractive index of the substrate. When this substrate is applied to a photoelectronic element, the light efficiency of the photoelectronic element is improved.

BRIEF DESCRIPTION OF DRAWINGS

FIGS. 1A to 6J are schematic views illustrating a method of forming a structure including quantum dots in a surface control region, according to various embodiments of the present invention.

FIGS. 8A, 8C, and 8E are views illustrating optical images of a second surface control layer having a first control pattern and a first surface control layer having a second control pattern (undercut) for a case where a development time is 20 seconds, according to a conventional art.

FIGS. 8B, 8D, and 8F are views illustrating optical images of a second surface control layer having a first control pattern and a first surface control layer having a second control pattern for different development times, according to one embodiment of the present invention.

Figure 9G:
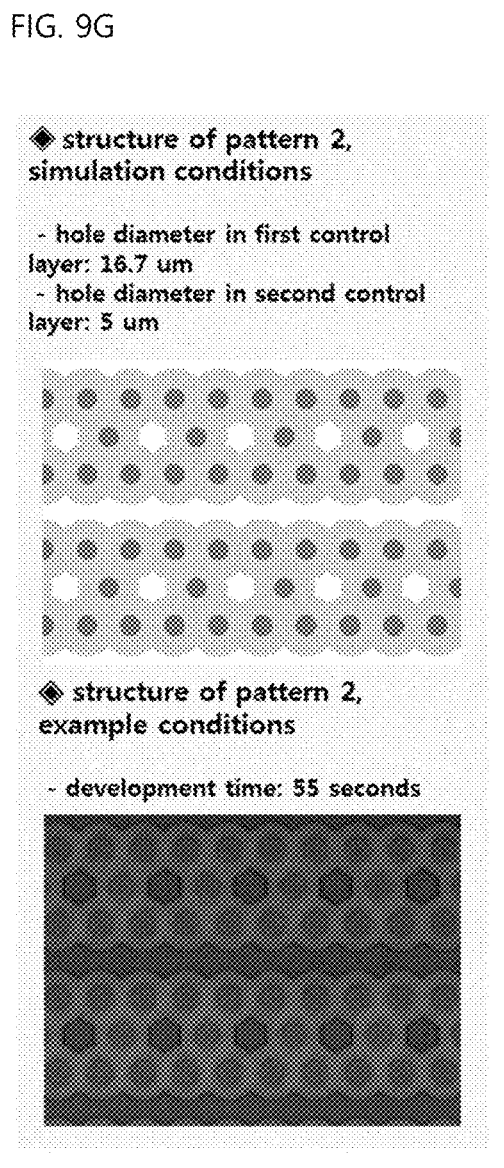

FIGS. 9A to 9H are comparison views for simulation results of various surface control regions and actual extension cuts on a substrate for volume adjustment of extension cuts, according to one embodiment of the present invention.

FIGS. 10A, 10B, 10C and 10D are views illustrating optical images (FIGS. 10A and 10B of surface-controlled substrates on which structures including quantum dots are formed according to one embodiment of the present invention and illustrating photoluminescence (PL) measurement results (FIGS. 10C and 10D) of the respective substrates.

FIGS. 11A to 11L are views illustrating optical images and PL measurement results of structures including a green quantum dot ink and a red quantum dot ink according to the concentration of the green quantum dot ink and the concentration of the red quantum dot ink after the formation of an etched pattern in a surface control region according to one embodiment of the present invention, in which FIGS. 11A, 11B, 11C, 11D, 11E, and 11F correspond to the cases where the concentration of green quantum dots is varied, FIGS. 11G, 11H, 11I, and 11J correspond to the cases where the quantity of dispensing of red quantum dots is varied, and FIGS. 11K, 11I, 11M, and 11N correspond to the cases where the spin coating condition of red quantum dots is varied.

FIGS. 12A to 12H are views illustrating optical images (FIGS. 12A and 12B of a structure including quantum dots formed by adjusting the mixing ratio of a green quantum dot ink and a red quantum dot ink after forming an etched pattern in a surface control region, and illustrating PL measurement results (FIGS. 12C, 12D, 12E, 12F, 12G, and 12H according to the quantum dot mixing ratios.

DETAILED DESCRIPTION OF THE DRAWINGS

Figure 7A:
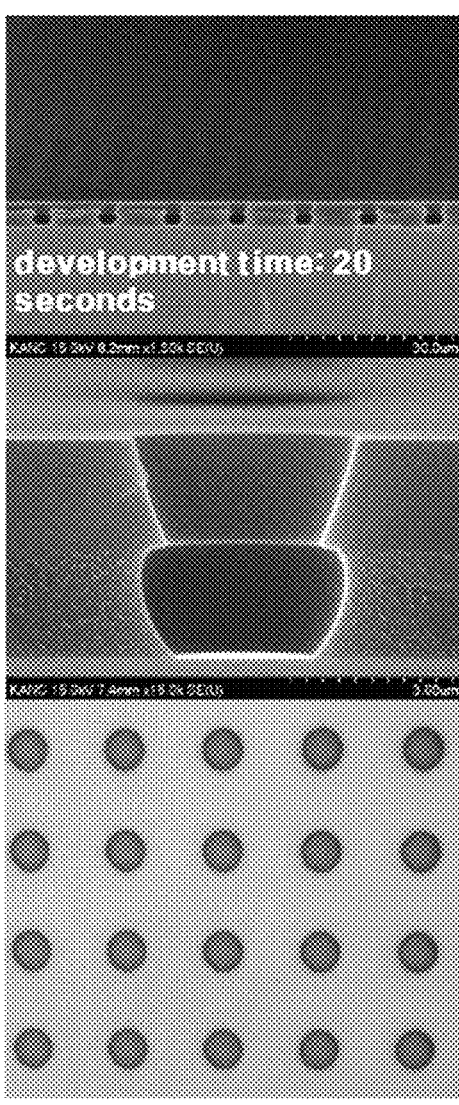
FIG. 7A is a view illustrating a scanning electron microscope (SEM) image and an optical image of a second surface control layer having a first control pattern and a first surface control layer having a second control pattern (undercut), according to a conventional art.

The present invention provides a surface-controlled substrate having a structure including quantum dots in a surface control region thereof. According to the present invention, a structure including quantum dots is formed in a surface control region of a substrate so that the surface of the substrate is controlled (a surface area increase, a surface shape adjustment, a surface characteristic adjustment, etc.) and the characteristics of the substrate are improved.

In particular, the present invention provides a surface-controlled substrate formed by diversely varying a quantum dot formation method, the concentration of quantum dots, or a mixing ratio of different types of quantum dots in a surface control region of a substrate. In this case, since the quantity of quantum dots at a specific position can be easily controlled, the surface-controlled substrate can implement light emission of various colors and easily adjust light intensity.

In addition, in the present invention, multiple surface control layers are formed on a substrate to increase the precision and freedom degree of surface area control for the substrate, so that the surface control of the substrate is facilitated. In addition, since a structure including characteristic-controlled quantum dots is formed on the substrate, the substrate with the quantum dots may find applications in various fields.

The present invention is intended to provide a photoelectronic element that is maximized in a light extraction efficiency and a light conversion efficiency in a manner that a structure including quantum dots is formed in a surface control region in a top layer of the photoelectronic element to increase the surface area of the top layer and to control the physical characteristics.

A method of forming a structure including quantum dots in a surface control region, according to the present invention, includes: a step of forming multiple surface control layers that are differ in etch resistance on a substrate; a step of securing a surface control region on the substrate by forming control patterns having different sizes depending on the etch resistances through an exposure process, in which a lower control pattern of the multiple control patterns has an extension cut extending from an upper control pattern of the multiple control patterns; a step of forming the structure including quantum dots in the surface control region by using the multiple surface control layers as masks; and a step of removing the surface control layers.

First, according to the present invention, the multiple surface control layers differing in etch resistance are formed on the substrate.

The present invention may be used to improve the performance or to express novel characteristics by diversely controlling surface conditions, for example, increasing a surface area, changing a surface shape, controlling a surface refractive index, or adjusting a surface characteristic. The present invention can be applied to any substrate if the objectives described above can be accomplished.

Specifically, the substrate may be an inorganic substrate, an organic substrate, a thin film, or a top layer of a semiconductor device, i.e., specifically a photoelectronic element, depending on the application. The surface of the substrate is controlled to be suitable in terms of use and purpose of the substrate. According to the present invention, it is possible to improve the surface characteristics of the substrate by forming a structure including quantum dots in the surface control region of the substrate.

For the surface control layer, an appropriate material may be selected according to the type, use, and purpose of the substrate and to a material of an adjacent surface control layer. Specifically, the material may be selected to improve coatability and film formability between the surface control layers adjacent to each other.

In particular, in the present invention, there are multiple surface control layers provided on the substrate. The surface control layers are made of different materials that are different in etch resistance. In addition, the shape, size, and arrangement of the control patterns formed in the surface control layers may be different. Therefore, the shape of each of the control patterns may be expressed even when the surface control patterns are superimposed with each other.

Preferably, the etch resistance of the surface control layer relatively far from the substrate is higher than that of the surface control layer relatively close to the substrate. Therefore, the closer to the top layer, the smaller the size of the control pattern formed in the surface control layer. In the present invention, the term "etching" covers all etching processes, including both physical and chemical. In particular, etching caused by a development process is also regarded as the etching defined in the present invention.

The shape and size of the control pattern formed in each of the surface control layers may vary depending on the type, thickness, and etch resistance of the surface control layer and on exposure process conditions (such as surface control layer thickness, energy irradiation time, development time, development temperature, curing temperature, curing time, etc.,). In order to form a structure including quantum dots in the optimal surface control region, the sizes of the control patterns may be adjusted.

Particularly, since the surface control layer close to the substrate affects the securing of the surface control region of the substrate, an appropriate material and an appropriate thickness are determined for the surface control layer, taking into account the area of the surface control region and the etch resistance in the exposure and etching process.

Control patterns with different sizes according to etch resistances are formed in the respective surface control layers by an exposure process. In this case, a relatively lower control pattern has an extension cut compared to a relatively upper control pattern.

In the present invention, the exposure process is a process of selectively irradiating surface control layers including a top surface control layer with energy according to the position or size of control patterns to be formed in the surface control layers, the exposed layers are cured to have an appropriate hardness, and a development process is formed. Through these processes, the control pattern is formed in each of the respective surface control layers.

Here, the shape and size of the control pattern formed in the surface control layer by the development process are adjusted according to the etch resistance of the surface control layer.

As described above, when the etch resistance of the surface control layer relatively close to the substrate is relatively low, the width of the control pattern relatively close to the substrate is relatively large. This is the surface control region formed on the substrate described below.

According to a development process used in a general exposure process, the control pattern of an upper layer is formed to have an under-cut shape compared to the control pattern of a lower layer. Therefore, it is difficult to obtain the surface control region according to the present invention.

In the present invention, the surface control layers are formed to differ in etch resistance, and an additional development is performed in the development process of the exposure process so that an extension cut that is larger than an undercut is formed.

The additional development process may be performed by increasing the development time, the concentration of a development solution, or a development temperature, or by using a different development solution different from a development solution used for primary development.

Therefore, a portion of the substrate uncovered by each control pattern is secured as a surface control region.

That is, the area of the surface control region on the substrate is controlled by adjusting the size of the extension cut, and this results in the surface control (surface area increasing, surface shape adjustment, surface characteristic adjustment, etc.) of the substrate.

In addition, after the development process or the additional development process is performed, the surface control layer is wet etched or dry etched to increase the size of the extension cut. This is a useful process that can be used to adjust the area of the surface control region of the substrate according to the purpose of the substrate.

The area of the control pattern formed in the surface control layer may be controlled according to exposure process conditions (thickness of the surface control layer, energy irradiation time, development time, development temperature, curing temperature, curing time, etc.).

That is, when the curing degree of the surface control layer is relatively high, the area of the surface control region of the substrate is relatively small. When the curing degree of the surface control layer is relatively low, the area of the surface control region of the substrate is relatively large. Therefore, the surface area control of the substrate can be easily performed.

The formation of the extension cut according to the control pattern to secure the surface control region of the substrate according to the present invention is controlled by the size and development of the control pattern, which depend on the exposure process conditions, the curing degree of the surface control layer, the development process conditions, or the etching process conditions.

In addition, a structure including quantum dots is formed in the surface control region by using the multiple surface control layers provided with the control patterns as masks.

Generally, quantum dots emit light corresponding to the bandgap energy when photons excited by external light are stabilized, and the wavelength of the emitted light varies depending on the size of the quantum dots. Therefore, the quantum dots can display various colors and are excellent in color reproduction.

As described above, in the present invention, the surface control of the substrate is first diversely performed by using the surface control layers, and a structure including quantum dots is then formed in the surface control region. Therefore, it is possible to control the surface of the substrate and to form various quantum dots in a specific position, so that diverse surface characteristics can be exhibited.

In the present invention, the term "structure including quantum dots" refers to a concept covering characteristics (surface area increasing, surface shape adjustment, and surface characteristic adjustment) and quantum dots formed to be superimposed. Alternatively, the term "structure including quantum dots" may refer to a quantum dot patterning structure.

As described above, the structure including quantum dots according to the present invention is formed in the surface control region. Therefore, it is possible to easily control the quantity of the quantum dots by using the surface control layer.

In the present invention, the term "quantity" of quantum dots refers to a variable that expresses the physical properties of quantum dots when a structure including quantum dots is formed in a surface control region. For example, the variable includes the type of quantum dots (one or two different types of quantum dots), a mixing ratio according to the type of quantum dots, a quantum dot formation method, the concentration of quantum dots, the diameter of quantum dots, the volume of quantum dots, and the positions of quantum dots. When the quantum dot formation method using a surface control layer, according to the present invention, has an advantage of easily controlling the quantity of quantum dots. Compared to existing quantum dot patterning processes, the method of the present invention is dramatically simplified and is considerably excellent in expression of characteristics of quantum dots.

In addition, it is possible to form one or more quantum dots that differ in structure or material in the surface control region by forming one type of quantum dots or two or more types of quantum dots while sequentially removing multiple surface control layers, or by forming two or more types of quantum dots while varying a mixing ratio of the two or more types of quantum dots. That is, a single quantum dot structure or a composite quantum dot structure composed of quantum dots superimposed in the surface control region may be formed.

In addition, aside from the formation of two or more quantum dot structures superimposed in the surface control region, the composite quantum dot structure may be formed in a manner of forming quantum dot structures after adjusting the surface characteristics of the substrate.

That is, in order to control or express the surface characteristics of a substrate by using the surface control layer as a mask, a composite quantum dot structure including a thin film structure and a quantum dot structure may be formed by a method in which the thin film structure is formed by applying or depositing a material having a different property from the substrate in the surface control region, and then forming the quantum dot structure in the surface control region provided with the thin film structure.

The quantum dots according to the present invention may be made of any one material or a combination of two more materials selected from the group consisting of CdS, CdSe, CdTe, ZnS, ZnSe, ZnTe, CuInS$_2$, HgS, HgSe, HgTe, CdSeS, CdSeTe, CdSTe, PbSe, PbS, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, CdZnSeS, CdZnSeTe, CdZnSTe, CdHgSeS, CdHgSeTe, CdHgSTe, HgZnSeS, HgZnSeTe, HgZnSTe, GaN, GaP, GaAs, AlN, AlP, AlAs, InN, InP, InAs, GaNP, GaNAs, GaPAs, AlNP, AlNAs, AlPAs, InNP, InNAs, InPAs, GaAlNP, GaAlNAs, GaAlPAs, GaInNP, GaInNAs, GaIn-PAs, InAlNP, InAlNAs, and InAlPAs.

The thin film structure may be a structure composed of one or more thin film layers having different surface characteristics from the substrate, and may be a member having different electrical or optical properties from the substrate. The thin film structure may be formed to be inclined in the surface control region by using a tilt evaporation process.

For example, materials having different refractive indexes may be deposited in the form of a single or multiple layers. In particular, when a multilayer form is deposited, the refractive indexes of the deposited materials are in decreasing order from the substrate. Alternatively, the refractive indexes of the deposited materials may be in increasing order from the substrate. Any one or more materials selected from among a metal, a metal oxide, a metal fluoride, a phosphide, a nitride, and a sulfide may be deposited in the form of a thin film.

By removing the surface control layer, only a structure including quantum dots remains in the surface control region of the substrate. As described above, various characteristics can be expressed by the surface of the substrate due to the presence of the quantum dots according to the quantity (type, concentration, formation method, mixing ratio, etc.) of the quantum dots.

In addition, the surface control layer may not be removed at the same time. Alternatively, a first quantum dot structure or a thin film structure may be formed in the surface control region of the substrate, and a different structure (for example, second quantum dot structure) from the first quantum dot structure may be formed in a superimposed manner using remaining surface control layers as masks while sequentially removing the surface control layers from the uppermost surface control layer. In this way, a composite quantum dot structure may be formed.

That is, the composite quantum dot structure formed on the substrate may be composed of a first quantum dot structure and a second quantum dot structure or may be composed of a thin film structure and a second quantum dot structure.

By performing this process repeatedly, each structure may be formed to be composed of two or more types of quantum dots, each structure may be formed to be composed of two or more quantum dots having different concentrations, each structure may be formed to be composed of two or more types of quantum dots having different ratios, or each structure may be formed to be composed of quantum dots having a large volume. The structure may be formed in the secured surface control region while the multiple surface control layers are sequentially removed and the remaining surface control layers are used as masks.

In particular, as described above, the closer to the substrate, the more largely etched the control pattern is formed in the surface control layer. That is, the control pattern with an extension cut is formed. By this method, the structure including quantum dots according to the present invention is formed in the secured surface control region.

In addition, the surface control region may undergo adhesion enhancing surface treatment or hydrophobic surface treatment as needed. These treatments enable more or less quantum dots having specific physical properties to be formed in the surface control region, enables the quantum dots to be formed in specific positions within the surface control region, or enables the quantum dots to be formed as a specific pattern in the surface control region.

The adhesion enhancing surface treatment performed on the surface control region on the substrate may be one or more methods selected from among promoter resin coating, oxygen plasma treatment, ultraviolet-ozone treatment, and microwave treatment.

The promoter resin may be any one or more selected from among hexamethyldisilzane (HMDS), acryloxypropyl methyl dichlorosilane (APMDS), 3-glycidoxypropylt-rimethoxysilane (GPTS), aminopropyltriethoxysilane (APTS), aminoalkyltrimethoxysilane (ATS), 3-aminopropy-ltriethoxysilane (APTES), and oxygen plasma treatment.

The hydrophobic surface treatment performed on the surface control region of the substrate may be one or more methods selected from among hydrophobic material coating and plasma treatment.

The hydrophobic material may be any one or more selected from among octadecyltrichlorosilane (OTS), 1H,1H,2H,2H-perfluorodecyltrichlorosilane (FTCS), tride-cafluoro-1,1,2,2-tetrahydrooctyltrichlorosilane (FOTS), dichlorodimethylsilane (DDMS), and diamond-like carbon (DLC).

Here, in the surface control region of the substrate, an etched pattern may be further formed by using the surface control layer provided with the control pattern as an etching mask. The structure including quantum dots may be formed on the etched pattern to implement a structure with an increased surface area and a three-dimensional pattern having any shape.

The etched pattern may be formed by a single etching process such as a dry etching process or a wet etching process while using the multiple surface control layers as etching masks. Alternatively, the etched pattern may be formed by a composite etching process in which a dry etching process and a wet etching process are sequentially performed in this order or in reverse order.

That is, depending on the depth, width, and arrangement of the etched pattern, it is possible to increase the surface area of the substrate or change the surface structure of the substrate, and to form a single quantum dot structure or a composite quantum dot structure in the region.

In addition, before removing the surface control layer, a protective layer may be formed on the structure including quantum dots using the surface control layer as a mask, thereby protecting the structure including quantum dots.

The protective layer protects the structure including quantum dots from the outside or prevents removal of a portion of the structure during the process of removing the surface control layer. The protective layer may be a thin film covering a portion of the structure including quantum dots or covering the entire area of the structure including quantum dots. The protective layer may have a high light transmittance property of transmitting light emitted from the structure including quantum dots.

In addition, heat treatment may be performed after forming the structure including quantum dots and before removing the surface control layer. The heat treatment is performed to adjust the quantity of quantum dots.

In this way, by using multiple surface control layers, it is possible to adjust the area of the surface control region and to adjust the structure, thereby improving the precision and freedom degree of surface control of the substrate. Therefore, the surface control is facilitated, and various surface characteristics can be expressed. Thus, the applicability of the substrate is improved.

Since it is possible to form a composite quantum dot structure by using multiple surface control layers as masks, it is easy to improve or express the surface characteristics of a substrate.

Herein below, with reference to the accompanying drawings, a case where two surface control layers are formed will be described as one embodiment of the present invention.

Figure 10A:
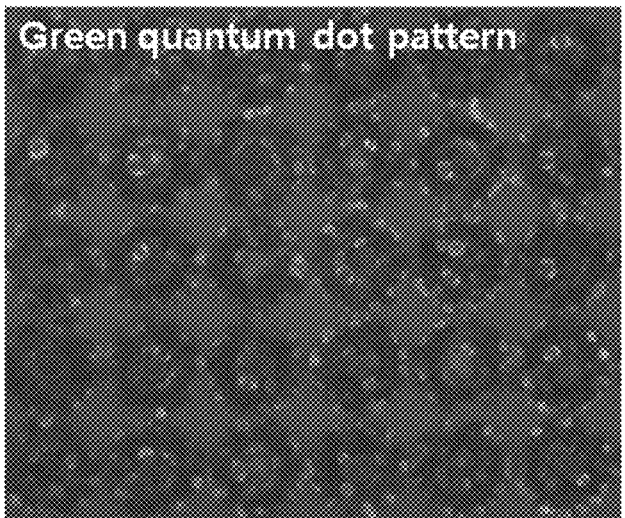
Figure 10B:
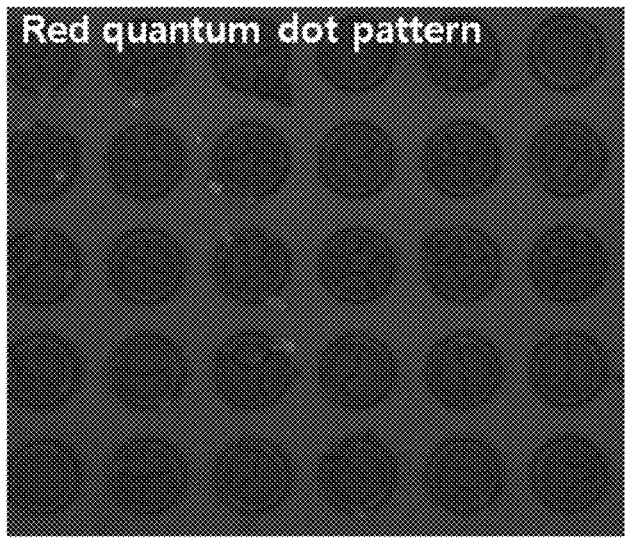

FIGS. 1 to 6 are diagrams illustrating a method of forming a structure including quantum dots in a surface control region composed of two layers, according to various embodiments of the present invention. FIG. 7A includes a scanning electron microscope (SEM) image and an optical image of a second surface control layer having a first control pattern and a first surface control layer having a second control pattern (undercut), according to a conventional art. FIGS. 7A, 7C, and 7D are images of data representing SEM images and optical images of a second surface control layer having a first control pattern and a first surface control layer having a second control pattern (extension cut), according to one embodiment of the present invention. FIGS. 8A, 8C, and 8D are optical images of a second surface control layer having a first control pattern and a second surface control layer having a first control pattern (undercut) under a condition of a development time of 20 seconds according to a conventional art, and 8B, 8D, and 8F are optical images of a second surface control layer having a first control pattern and a first control layer having a second control pattern (extension cut). FIG. 9 is a diagram illustrating pattern simulation results of various surface control regions on a substrate for volume regulation of an extension cut, according to one embodiment of the present invention, and actual extension cuts. FIGS. 10A and 10B are optical images of a surface-controlled substrate provided with a structure including quantum dots according to one embodiment of the present invention, FIGS. 10C and 10D are diagrams illustrating measurement results of photoluminescence (PL) for each case. FIGS. 11A to 11M illustrate optical images and measurement results of PL changes for a structure including a green quantum dot ink and a red quantum dot ink according to variation in concentration of the green quantum dot ink and concentration of the red quantum dot ink after forming an etch pattern in a surface control region according to one embodiment of the present invention, in which FIGS. 11A, 11B, 11C, 11D, 11E, and 11F relate to variation in concentration for green quantum dots, 11G, 11H, 11I, and 11J relate to variation in dispensing quantity for red quantum dots, and 11K, 11L, 11M, and 11N relate to variation in spin-coating condition for red quantum dots. FIGS. 12A and 12B illustrate optical images of a structure including quantum dots formed by adjusting a mixing ratio of a green quantum dot ink and a red quantum dot ink after forming an etch pattern in a surface control region according to one embodiment of the present invention, and FIGS. 12D, 12E, 12F, 12G, and 12H illustrate measurement results of PL changes according to mixing ratios of quantum dot inks.

As illustrated in the drawings, according to one embodiment of the present invention, a method of forming a structure 400 including quantum dots in a surface control region 110 includes: a first step of forming a first surface control layer 200 on top of a substrate 100; a second step of forming a second surface control layer 300 having a relatively high etch resistance than the first surface control layer 200 on top of the first surface control layer 200; a third step of forming a first control pattern 310 in the second surface control layer 300 by an exposure process; a fourth step of forming a second control pattern 210 in the first surface control layer 200, in the form of an extension cut extending from the first control pattern 310, continuously or subsequently to the formation of the first control pattern 310; a fifth step of securing the surface control region 110 of the substrate 100 by using the second control pattern 210 of the first surface control layer 200; a sixth step of forming a first quantum dot structure 411 or a thin film structure 420 in the surface control region 110 by using the second surface control layer 300 having the first control pattern 310 and the first surface control layer 200 having the second control pattern 210 as a mask; and a seventh step of forming a first quantum dot structure 411 on the substrate 100 by removing the second surface control layer 300 and the first surface control layer 200, or of forming a second quantum dot structure 412 in the surface control region 110 by removing the second surface control layer 300 and using the first surface control layer 200 provided with the second control pattern 210 as a mask, and forming, on the substrate 100, a composite quantum dot structure composed of the first quantum dot structure 411 and the second quantum dot structure 412 or composed of the thin film structure 420 and the second quantum dot structure 412 by removing the first surface control layer 200 provided with the second control pattern 210.

First, the first surface control layer 200 is formed on the substrate 100 (first step).

The substrate 100 according to the present invention may be an inorganic substrate, an organic substrate, or a thin film depending on applications thereof. Alternatively, the substrate 100 may be a top layer of a semiconductor device (specifically, a photoelectronic device). The substrate 100 may be surface-controlled such that a structure 400 including quantum dots is formed on the surface of the substrate 100 according to the use or purpose of the substrate.

Specifically, the substrate 100 may be an inorganic substrate made of a material selected from among silicon (Si), gallium arsenide (GaAs), gallium phosphorus (GaP), gallium arsenide (GaAsP), boron nitride (BN), SiC, GaN, ZnO, MgO, InP, Ge, InAs, GaSb, sapphire, quartz, and glass.

Alternatively, depending on the applications, the substrate may be a substrate made of any one polymer selected from among polycarbonate (PC), polyethylene naphthalate (PEN), polynorbornene (PN), polyacrylate, polyvinyl alcohol (PVA), polyimide (PI), polyethylene terephthalate (PET), polyethersulfone (PES), polystyrene (PS), polypropylene (PP), polyethylene (PE), polyvinylchloride (PVC), polyamide (PA), polybutylenephthalate (PBT), polyester, polymethyl methacrylate (PMMA), and polymethylmethylsiloxane (PDMS).

According to one embodiment of the present invention, the substrate 100 may be a semiconductor laminate having an n-type semiconductor layer or a p-type semiconductor layer as the top layer. According to the present invention, on the top surface, the structure 400 including quantum dots is formed in the surface control region 110.

The material of the first surface control layer 200 is selected depending on the type, use, and function of the substrate 100 and on the type of the second surface control layer 300 to be described later. In particular, the first surface control layer 200 is made of a material that enables the second surface control layer 300 to be easily coated or applied and which has a lower etch resistance than the second surface control layer 300.

Since the first surface control layer 200 is formed on the upper surface of the substrate 100 and is involved in securing the surface control region 110 of the substrate 100, the first surface control layer 200 is formed to a suitable thickness using a suitable material according to the area of the surface control region 110 of the substrate 100 and the etch resistance that affects a development process and an etching process.

The first surface control layer 200 may be made of any one or more materials selected from among polyvinyl chloride (PVC), neoprene, polyvinyl alcohol (PVA), poly(methylacrylate) (PMMA), poly(benzyl methacrylate) (PBMA), polystyrene, spin on glass (SOG), polydimethylsiloxane (PDMS), poly(vinyl formal) (PVFM), parylene, polyester, epoxy, polyether, polyimide, polymethylglutarimide (PMGI), methyl methacrylate/methacrylic acid (MMA/MAA), poly(methylmethacrylate-co-methacrylic acid) (P(MMA-co-MAA)), and lift-off-resist (LOR).

The first surface control layer 200 is formed by spin coating, dip coating, or spray coating on the upper surface of the substrate 100. The first surface control layer 200 is heated to a temperature in a range of 50° C. to 300° C. for 15 seconds to 10 minutes and thus finally has a thickness of approximately 50 μm or less.

Alternatively, depending on the type and thickness of the first surface control layer 200, the deposition or coating conditions may vary. The deposition or coating of the first surface control layer 200 may be performed in various ways.

Next, the second surface control layer 300 having a high etch resistance than the first surface control layer is formed on the first surface control layer 200 (second step).

When the term "high etch resistance of the second surface control layer" means that when the first surface control layer 200 and the second surface control layer 300 are simultaneously etched, the etch rate of the first surface control layer 200 is higher than that of the second surface control layer 300. In the present invention, the term "etching" covers all etching processes, including both physical and chemical. In particular, etching caused by a development process is also regarded as the etching defined in the present invention.

Preferably, the etch resistance ratio of the first surface control layer 200 and the second surface control layer 300 is in a range of 1:1.1 to 1.1:10. This is an optimal condition for securing the surface control region 110 on the substrate 100. When the etch rate of the first surface control layer 200 is higher than the upper limit of the above-described range, barrier walls made of the first surface control layer 200 collapse, so that a pattern cannot be formed in the surface control region 110, or adjacent lines of the pattern may be abutted. When the etch rate is lower than the lower limit of the above-described range, the surface control region 110 cannot effectively function.

The second surface control layer 300 may be made of a photoresist or photosensitive metal-organic precursor material having a relatively high etch resistance compared to the first surface control layer 200.

The photoresist may be a positive-type photoresists or a negative-type photoresists. The photoresist may be an electron beam resist, a KrF resist, or an ArF resist.

To adjust the etch resistance, the photoresist may contain silicon or metal oxide nanoparticles. The second surface control layer is made of a material having a higher etch resistance than the first surface control layer 200.

The photosensitive metal-organic precursor may be synthesized by mixing a metal-organic precursor and an organic solvent. Various metals, such as a photosensitive Zn-organic precursor, a photosensitive Sn-organic precursor, and a photosensitive Ti-organic precursor, are included in the photosensitive metal-organic precursor to increase etch resistance compared to the first surface control layer 200.

The photoresist and the photosensitive metal organic precursor are applied on the first surface control layer 200 by a method such as spin coating, dip coating, or spray coating, and then cured. However, the degree of curing (heat, light, or heat and light) is adjusted according to the area of the surface control region 110.

The first control pattern 310 is formed in the second surface control layer 300 through an exposure process (third step).

In the exposure process, the shape, size, and arrangement of the first control patterns 310 are determined depending on the area of the surface control region 110. The first control patterns 310 are formed in the second surface control layer 300 by selectively exposing the upper surface of the second control layer 300 to heat or light (violet-rays, ultraviolet-rays, electron beams, or X-rays). Alternatively, the exposure is performed with a specifically designed mask positioned on or above the second surface control layer 300, and then the layer undergoes a development process. In this way, the first control patterns 310 are formed in the second surface control layer 300.

Here, the degree of curing of the second surface control layer 300 can be adjusted by irradiating the second surface control layer 300 with an appropriate intensity of energy. By this, the size of the first control patterns 310 can be controlled.

In addition, in the development process, the process conditions such as the type and concentration of a development solution, the development time, and the development temperature are determined depending on the area of the surface control region 110.

Successively or sequentially to the formation of the first control patterns 310 formed in the second surface control layer 300, second control patterns 210 that are extension cuts extending from the respective first control patterns 310 are formed in the first surface control layer 200 (fourth step). The second control patterns 210 formed in the first surface control layer 200 secure the surface control regions 110 of the substrate 100 (fifth step).

In the fifth step, the size of the surface control regions 110 can be controlled by changing the area of the second control patterns 210 that are extension cuts formed in the fourth step.

When a conventional development process is used, the second control patterns 210 are formed as under-cuts of the first surface control layer 200 underneath the first control patterns 310. Therefore, it is difficult to obtain the surface control regions 110 according to the present invention.

According to the present invention, in addition to the development process following the exposure process performed in the third step, an additional over-development process is performed to form the second control patterns 210 that are extension cuts larger than the undercuts.

The over-development process may be accomplished by increasing the duration of development, the concentration of a development solution, or a development temperature, or by using different development solutions respectively for the formation of the first control patterns 310 and the formation of the second control patterns 210.

Therefore, an extension cut formed under the first control pattern 310 of the second surface control layer 300 serves as the second control pattern 210. Therefore, a portion of the substrate 100 exposed due to the pattern is secured as the surface control region 110.

That is, the area of the surface control region 110 of the substrate 100 is controlled by adjusting the size of the extension cut (i.e., the area of the second control pattern 210), and thus the surface control (surface area expansion, surface shape adjustment, surface characteristic adjustment, etc.) of the substrate 100 can be achieved.

After the development process or the additional over-development process is performed, the first surface control layer 200 is wet etched or dry etched to form the second control pattern 210 that is an increased cut of the extension cut. This is a useful process that can be used to adjust the area of the surface control region 110 of the substrate 100 according to the purpose.

The area of the second control pattern 210 of the first surface control layer 200 is controlled according to the curing degree of the first surface control layer 200 in addition to the development time and the development temperature as described above.

That is, when the curing degree of the first surface control layer 200 is relatively high, the area of the surface control region 110 of the substrate 100 is relatively small. When the curing degree of the first surface control layer 200 is relatively low, the area of the surface control region 110 of the substrate 100 is relatively large. Therefore, the surface area control of the substrate 100 can be achieved very easily.

As described above, the formation of the extension cut in the first surface control layer 200 for securing the surface control region 110 of the substrate 100 is controlled according to the size, shape, and arrangement of the first control pattern 310 of the second surface control layer 300, the size, shape, and arrangement of the second control pattern 210 of the first surface control layer 200, the curing degree of the first surface control layer 200, the curing degree of the second surface control layer 300, and the development process conditions.

In addition, the second control pattern 210 may be formed as an extension cut by a process that is continuous to the process of forming of the first control pattern 310. Alternatively, the second control pattern 210 may be formed as an extension cut by a process that is subsequently performed to the process of forming the first control pattern 310. That is, after the formation of the first control pattern, an additional exposure process and an additional development, wet-etching, or dry-etching process may be performed to form the second control pattern 210 under conditions different from the exposure and development processes for forming the first control pattern 310.

The surface control region 110 may undergo adhesion enhancing treatment or hydrophobic treatment as needed. These treatments enable more or less quantum dots having a specific physical property to be formed in the surface control region 110, enables the quantum dots to be formed in a specific position within the surface control region 110, or enables the quantum dots to be formed as a specific pattern in the surface control region 110.

The adhesion enhancing treatment is performed by coating the surface control region 110 of the substrate 100 with a promoter resin or by performing one or more methods selected from among oxygen plasma treatment, ultraviolet-ozone treatment, and microwave treatment on the surface control region 110 of the substrate 100.

The promoter resin may be any one or more selected from among hexamethyldisilzane (HMDS), acryloxypropyl methyl dichlorosilane (APMDS), 3-glycidoxypropylt-rimethoxysilane (GPTS), aminopropyltriethoxysilane (APTS), aminoalkyltrimethoxysilane (ATS), 3-aminopropy-ltriethoxysilane (APTES), and oxygen plasma treatment.

The hydrophobic treatment is performed by coating the surface control region 110 of the substrate 100 with a hydrophobic material or by performing one or more methods such as plasma treatment on the surface control region 110 of the substrate 100.

The hydrophobic material may be any one or more selected from among octadecyltrichlorosilane (OTS), 1H,1H,2H,2H-perfluorodecyltrichlorosilane (FTCS), tridecafluoro-1,1,2,2-tetrahydrooctyltrichlorosilane (FOTS), dichlorodimethylsilane (DDMS), and diamond-like carbon (DLC).

By such treatment, the substrate 100 provided with the surface control regions 110 having various surface characteristics can be obtained. The larger the number of surface control layers, the higher the degree of freedom and precision of the surface area control of the substrate 100. Therefore, the surface area control region 110 can be easily controlled and can be improved in applicability. The surface control region 110 is provided with a structure including quantum dots, according to the present invention.

The second surface control layer 300 having the first control pattern 310 and the first surface control layer 200 having the second control pattern 210 are used as a mask to form a first quantum dot structure 411 or a thin film structure 420 in the surface control region 110 (sixth step).

The sixth step is to form structures in the surface control regions 110 secured by the multiple surface control layers. In the present invention, to improve or express the characteristics of the surface of the substrate 100, the quantum dot structure 410 or the thin film structure 420 is formed.

The quantum dots emit light corresponding to the bandgap energy as photons excited by external light are stabilized, and the wavelength of the emitted light varies depending on the sizes of the quantum dots, and thus various colors can be displayed.

The quantum dots are excellent in color reproduction, quantum efficiency, and photostability, and the quantum dots are considered as elements that can compensate for the disadvantages of LEDs. The quantum dots are applicable to various photoelectronic elements, and all colors can be expressed according to particle sizes.

In the present invention, structures including quantum dots are formed in the diversely surface-controlled surface control regions 110 of the substrate 100. That is, the present invention is to improve the surface characteristics of the substrate 100 or to help the expression of a specific characteristic so that the characteristics of the quantum dots can be expressed.

The first quantum dot structure 411 may be formed by controlling the amount of quantum dots in the surface control region 110. For example, the types of quantum dots (one type of quantum dots are used or two or more types of quantum dots are used), mixing rate of different types of quantum dots, quantum dot formation method, the concentration of quantum dots, the diameter of the quantum dots, the volume of quantum dots, and the positions of quantum dots may be controlled.

The method of controlling the quantity of quantum dots using the surface control layer according to the present invention has an advantage of being dramatically simplified compared to the existing quantum dot patterning processes and of being excellent in expression of the characteristics of the quantum dots.

The present invention can be varied in terms of structure and material in such a manner that one or more types of quantum dots are formed, quantum dots are formed in the surface control region by different methods, quantum dots with different concentrations are formed, one type of quantum dots or two or more types of quantum dots are formed by sequentially removing multiple surface control layers, quantum dots with different volumes are formed, or two or types of quantum dots are formed in various mixing ratios.

That is, a single quantum dot structure or a composite quantum dot structure in which different types of quantum dots are superimposed may be formed in the surface control region, so that applications thereof can be diversified and applicability thereof can be improved.

The quantum dots may be made of any one material or a combination of two more materials selected from the group consisting of CdS, CdSe, CdTe, ZnS, ZnSe, ZnTe, CuInS2, HgS, HgSe, HgTe, CdSeS, CdSeTe, CdSTe, PbSe, PbS, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, CdZnSeS, CdZnSeTe, CdZnSTe, CdHgSeS, CdHgSeTe, CdHgSTe, HgZnSeS, HgZnSeTe, HgZnSTe, GaN, GaP, GaAs, AlN, AlP, AlAs, InN, InP, InAs, GaNP, GaNAs, GaPAs, AlNP, AlNAs, AlPAs, InNP, InNAs, InPAs, GaAlNP, GaAlNAs, GaAlPAs, GaInNP, GaInNAs, GaInPAs, InAlNP, InAlNAs, and InAlPAs.

The thin film structure 420 may be a single-layer thin film or a multilayer thin film having different surface characteristics from the substrate 100. The thin film structure 420 is formed by using the second surface control layer 300 provided with the first control pattern 310 and the first surface control layer 200 provided with the second control pattern 210 as masks.

The thin film structure 420 may be formed by depositing a material having a different electrical or optical property from the substrate 100, for example, a material having a different refractive index, in the form of a single layer or a multilayer. In particular, when a multilayer form is deposited, the refractive indexes of the deposited materials are in decreasing order from the substrate. Alternatively, the refractive indexes of the deposited materials may be in increasing order from the substrate. Any one or more materials selected from among a metal, a metal oxide, a metal fluoride, a phosphide, a nitride, and a sulfide may be deposited in the form of a thin film.

Next, the second surface control layer 300 and the first surface control layer 200 are removed to form a first quantum dot structure 411 on the substrate 100, or the second surface control layer 300 is removed and the first surface control layer 200 is used as a mask to form a second quantum dot structure 412 in the surface control region 110, and the first surface control layer 200 provided with the second control pattern 210 is removed to form a composite quantum dot structure composed of the first quantum dot structure 411 and the second quantum dot structure 412 or composed of the thin film structure 420 and the second quantum dot structure 412 on the substrate 100 (seventh step).

That is, in order to form only the first quantum dot structure 411 composed of quantum dots, both the second surface control layer 300 and the first surface control layer 200 are removed. In this case, the quantity of the first quantum dot structure 411 may be controlled so that the surface characteristics of the substrate 100 can be controlled or specific surface characteristics can be expressed. Here, the first quantum dot structure 411 may be formed by using one or more quantum dot materials.

In addition, the surface control layers are not removed at the same time. The second surface control layer 300 provided with the first control pattern 310 and the first surface control layer 200 provided with the second control pattern 210 are used as masks to form the first quantum dot structure 411 or the thin film structure 420 in the surface control region 110 (sixth step). The second surface control layer 300 is removed, and the first surface control layer 200 provided with the second control pattern 210 is used as a mask to form the second quantum dot structure 412 in the surface control region 110. Subsequently, the first surface control layer 200 provided with the second control pattern 210 is removed to form a composite quantum dot structure composed of the first quantum dot structure 411 and the second quantum dot structure 412 or composed of the thin film structure 420 and the second quantum dot structure 412 on the substrate 100 (seventh step).

That is, the surface control region 110 of the substrate 100 may be provided with a composite quantum dot structure in which structures different from the first quantum dot structure 411 are superimposed with each other. By performing this process repeatedly, each structure may be formed of different materials. Alternatively, in the case of different structures or quantum dots, the structures or quantum dots may be formed in different positions or may be formed in a superimposed manner in the same position, with different concentrations, by different formation methods, at different mixing ratios, or the like.

As described above, for the multiple surface control layers according to the present invention, the closer surface control layer to the substrate, the more largely etched control pattern (i.e., control pattern with a larger extension cut) is formed in the surface control layer. Due to this, the structure according to the present invention can be formed in the secured surface control region 110.

In addition, it is preferable to protect one or more of the first quantum dot structure 411, the second quantum dot structure 412, and the composite quantum dot structure by forming a protective layer after the sixth step or before removing the first surface control layer 200 provided with the second control pattern 210 in the seventh step.

That is, the second surface control layer 300 provided with the first control pattern 310 and the first surface control layer 200 provided with the control pattern 210 are used as masks to form the first quantum dot structure 411 in the surface control region 110 in the sixth step, and then the protective layer may be formed to protect the first quantum dot structure 411. Alternatively, after removing the second surface control layer 300 in the seventh step, the first surface control layer 200 provided with the second control pattern 210 is used as a mask to form the second quantum dot structure 412 in the surface control region 110. Next, before removing the first surface control layer 200 provided with the second control pattern 210, the protective layer is formed to protect the second quantum dot structure or the composite quantum dot structure.

The protective layer protects the quantum structure according to the present invention the outside or prevents removal of a portion of the quantum structure during the process of removing the surface control layer because the quantum dot structure is likely to be partially removed at the time of removing the surface control layer. The protective layer may be a thin film partially or entirely covering the quantum dot structure and may have a high light transmittance property of transmitting light emitted from the first quantum dot structure 411, the second quantum dot structure 412, and the composite quantum dot structure.

Specifically, the protective layer may be SiO2, TiO2, or a repeated laminate structure of SiO2/TiO2. Alternatively, the protective layer may be an inorganic protective layer made of one or more materials selected from among SiNx, SiON, Al2O3, MgO, Ta2O5, HfO2, ZrO2, ZnO, ZnS, and MgF2, or may be an organic protective layer made of any one or more materials selected from among polycarbonate (epoxy), polycarbonate (PC), polyethylene naphthalate (PEN), polynorbornene (PN), polyacrylate (PVN), polyvinyl alcohol (PVA), polyimide (PI), polyethylene terephthalate (PT), polyethersulfone (PES), polystyrene (PS), polypropylene (PP), polyvinylchloride (PE), polyvinylacetamide (PVC), polyvinyl alcohol (PVA), polyimide (PI), polyethylene terephthalate (PET), polyethersulfone (PES), polystyrene (PS), polypropylene (PP), polyethylene terephthalate (PVC), polyethylene terephthalate (PBMA), polyethylmethylmethylmethacrylate (PMMA), and polymethylmethacrylate (PMMA).

In addition, it is preferable to perform heat treatment after forming the first quantum dot structure 411, the second quantum dot structure 412, or the composite quantum dot structure before removing the first surface control layer 200 or the second surface control layer 300.

To adjust the quantity of quantum dots, any one method selected from among thermosetting treatment using an oven or hot plate, plasma treatment, ultraviolet-ozone treatment, and microwave treatment may be used.

Specifically, the thermosetting treatment may be performed at a temperature in a range of 40° C. to 250° C. for a period of 10 seconds to 1 hour. The plasma treatment, ultraviolet-ozone treatment, and microwave treatment may be performed for a period of 10 seconds to 1 hour. This process serves to maintain or adjust the amount of quantum dots formed in the surface control region prior to removing the surface control layer.

A solvent for removal of the first surface control layer 200 and the second surface control layer 300 is at least one selected from the group consisting of acetone, isopropyl alcohol, hydrofluoric acid (HF), phosphoric acid (H3PO4), hydrochloric acid (HCl), nitric acid (HNO3), acetic acid (CH3COOH), sulfuric acid (H2SO4), dihydrogenoxide (H2O2), potassium hydroxide (KOH), 4-methyl-2-pentanone, ketone, methyl iso butyl ketone (MIBK), methyl ethyl ketone, water (H2O), methanol (CH3OH), ethanol (C2H5OH), propanol, isopropanol, butanol, pentanol, hexanol, dimethyl sulfoxide (DMSO), dimethylformamide (DMF), N-methyl pyrrolidone (NMP), 1-methyl-2-pyrrolidone, 1-methyl-3-pyrrolidone, dimethylacetamide, N,N-dimethylacetamide, N-amyl acetate, tetramethylammonium hydroxide (TMAH), acetonitrile, tetrahydrofuran (THF), nonane (C9H2O), octane, heptane, pentane, 2-methoxyethanol, ZDMAC, and AZ 300 MIF Here, an etched pattern 430 may be formed in the surface control region 110 of the substrate 100, with the use of the second surface control layer 300 provided with the first control pattern 310 and the first surface control layer 200 provided with the second control pattern 210 as etching masks. The quantum dot structure described above may be formed on the etched pattern 430 to implement 3-dimensional structures having structure having various characteristics and structures.

The etched pattern 430 may be formed by a single etching process such as a dry etching process or a wet etching process while using the multiple surface control layers as etching masks. Alternatively, the etched pattern may be formed by a composite etching process in which a dry etching process and a wet etching process are sequentially performed in this order or in reverse order.

That is, according to the depth, width, arrangement, or the like of the etched pattern 430, the surface area of the substrate 100 can be increased or the surface shape of the substrate 100 can be changed. In this region, a composite quantum dot structure such as one or more types of quantum dot structures or a composite quantum dot structure such as a thin film structure 420 is formed.

In this way, the substrate 100 provided with a structure 400 including quantum dots in the surface control region 110 is provided. Due to the formation of multiple surface control layers, the precision and freedom degree of the surface control of the substrate 100 can be improved, and various surface characteristics can be expressed. That is, the applicability of the substrate is improved.

Accordingly, the present invention provides the substrate 100 having the surface control region 110 that is secured by the multiple surface control layers having control patterns, and the present invention provides the surface-controlled substrate 100 having the quantum dot structure 400 that is formed in the surface control region 110 of the substrate 100 by using the multiple surface control layers provided with control patterns as masks.

According to one embodiment of the present invention, when two surface control layers are formed, the second control pattern 210 of the first surface control layer 200 depends on the arrangement, pattern thickness, distance between patterns, and the shape of the pattern. That is, the extension cut region is adjusted according to the first control pattern 310 of the second surface control layer 300.

For example, the arrangement of the second control pattern 210 of the first surface control layer 200 may be determined according to the arrangement of the first control pattern 310 of the second surface control layer 300. Alternatively, the pattern shape may be adjusted according to the distance between the first control patterns 310 of the second surface control layer 300.

According to one embodiment of the present invention, when the arrangement of the first control patterns 310 of the second surface control layer 300 is a square array (hexagonal array) under specific extension cur formation conditions, the arrangement of the second control patterns 210 of the first surface control layer 200 is a square array (hexagonal array). In addition, when the distance between the first control patterns 310 of the second surface control layer 300 is uniform under specific extension cut formation conditions, the second control patterns 210 of the first surface control layer 200 can be connected to each other. On the other hand, when the distance between the patterns is not uniform, the patterns can be separated from each other.

In connection with the etched pattern 430, a secondary etched pattern, a tertiary etched pattern, or the like may be formed while removing the surface control layer. The tertiary etched pattern is superimposed on the primary etched pattern and the secondary etched pattern.

In addition, depending on the number of surface control layers, a dry or wet etching process may be performed multiple times in a direction in which the surface area increases or in a direction in which the surface shape changes, so that the n-th etched pattern is formed in a superimposed manner. The surface control region 110 is provided with the structure 400 according to the present invention.

As described above, the first quantum dot structure 411, the second quantum dot structure 412, the thin film structure 420, and the etched pattern 430 organically and complexly depend on the number or thickness of the surface control layers or the size of the first control pattern 310 and the second control pattern 210 having an extension cut form.

That is, with the adjustment of the size of the first control pattern 310 and the second control pattern 210, it is possible to change the surface state of the substrate 100 and to adjust the shape and increase of the surface area of the substrate 100. Therefore, the structure 400 including quantum dots may be in various forms in the surface control region 110 of the substrate 100.

This structure improves the inherent characteristics of the substrate 100 or expresses specific characteristics. For example, as the thin film structure 420, a material having a different refractive index than the substrate 100 is deposited in the surface control region 110, or a thin film layer having a different hydrophilicity from the substrate 100 or a different electrical or chemical property from the substrate 100 may be formed as needed.

According to one embodiment of the present invention, a refractive index control layer is formed as the thin film layer. A material having a refractive index different from that of the substrate 100 is deposited as a single-layer thin film or a multilayer thin film to control the refractive index.

According to one embodiment of the present invention, to control the refractive index of the substrate 100, the refractive index control layer is formed by depositing a material having a refractive index different from that of the substrate 100 in the etched pattern 430 formed by performing a dry etching process, a wet etching process, or a composite etching process in which a dry etching process follows a wet etching process, or a wet etching process follows a dry etching process, on the surface control region 110 formed as the extension cut of the first surface control layer 200.

When multiple refractive index control layers are deposited, deposition on the substrate 100 may start with a material having a relatively high refractive index from the substrate 100, so that the refractive indexes of the deposited materials on the substrate 100 are in decreasing order. Alternatively, the refractive indexes of the deposited materials on the substrate 100 may be in increasing order from the substrate 100.

Here, in a state in which the refractive index control layer is formed in the surface control region 110, one or more types of quantum dot structures may be formed as described above to form a composite quantum dot structure.

The substrate 100 may be used to improve a light extraction efficiency because it is possible to easily control an optical path with the use of a combination of a quantum dot structure and a thin film structure that is a thin film layer (refractive index control layer), or the substrate may be used to improve a light conversion efficiency by inducing diffuse reflection or total reflection as needed.

In addition, a detector may be appropriately configured depending on the use of a sensor, the light emitted from the detector can be modulated, and the intensity of the light can be adjusted. Therefore, the substrate can be used in various electronic devices.

According to one embodiment of the present invention, the substrate 100 may be the top layer of a photoelectronic element.

The photoelectronic element may be any one of a light-emitting diode (LED), a micro-LED, a solar cell, a laser diode (LD), a photodiode (PD), and an avalanche photo diodes (APD).

In the case of a light-emitting diode (LED) among photoelectronic elements, in the case of an n-type semiconductor layer or an p-type semiconductor layer formed as the top layer, the refractive index control layer formed as the thin film structure 420 is formed of a material having a lower refractive index than the substrate 100 or formed of materials having refractive indexes that are in decreasing order from the substrate 100, thereby reducing the difference in refractive index between the substrate 100 and the air, thereby improving the light extraction efficiency of the LED.

The refractive index control layer may be deposited as a thin film by using one or more materials selected from among a metal, a metal oxide, a fluoride, a phosphate, a nitride, and a sulfide according to the use of the substrate 100.

FIGS. 1 to 6 are views illustrating a method of forming a structure in a surface control region 110 on a substrate 100 when two surface control layers are formed, according to one embodiment of the present invention.

In one embodiment illustrated in FIGS. 1A to 1G, a first surface control layer 200 is formed on the substrate 100, and a second surface control layer 300 having a higher etch resistance than the first surface control layer 200 is formed on the first surface control layer 200 (FIG. 1A).

A first control pattern 310 is formed in the second surface control layer 300 through an exposure process. Continuously or subsequently to the formation of the first control pattern 310 in the second surface control layer 300, a second control pattern 210 having an extension cut form extending from the first control pattern 310 is formed in the first surface control layer 200. With the use of the second control pattern 210 formed in the first control layer 200, a surface control region 110 is secured on the substrate 100 [FIG. 1B and FIG. 1C].

The second surface control layer 300 provided with the first control pattern 310 and the first surface control layer 200 provided with the second control pattern 210 are used as masks to form a first quantum dot structure 411 in the surface control region 110 [FIG. 1D illustrating a case where the first quantum dot structure 411 is made of a single metal, and FIG. 1F illustrating a case where the first quantum dot structure 411 is made of two or more metals].

Next, all of the surface control layers are removed to form the first quantum point structure 411 in the surface control region 110 of the substrate 100 [FIGS. 1E and 1G].

In one embodiment illustrated in FIGS. 2A to 2F, a first surface control layer 200 is formed on the substrate 100, and a second surface control layer 300 having a higher etch resistance than the first surface control layer 200 is formed in the first surface control layer 200 (FIG. 2A).

A first control pattern 310 is formed in the second surface control layer 300 through an exposure process. Continuously or subsequently to the formation of the first control pattern 310 in the second surface control layer 300, a second control pattern 210 having an extension cut form extending from the first control pattern 310 is formed in the first surface control layer 200. With the use of the second control pattern 210 formed in the first control layer 200, a surface control region 110 is secured on the substrate 100 [FIGS. 2B and 2C].

The second surface control layer 300 provided with the first control pattern 310 and the first surface control layer 200 provided with the second control pattern 210 are used as masks to form an etched pattern 430 in the surface control region 100 (FIG. 2D).

Next, the second surface control layer 300 provided with the first control pattern 310 and the first surface control layer 200 provided with the second control pattern 210 are used as masks to form a first quantum dot structure 411 in the surface control region 110 [FIG. 2E illustrating a case where the first quantum dot structure 411 is made of a single metal, and FIG. 2G illustrating a case where a second quantum dot structure 412 is made of two or more metals].

Next, all of the surface control layers are removed to form the first quantum point structure 411 in the surface control region 110 of the substrate 100 (FIGS. 2H and 2F).

In one embodiment illustrated in FIGS. 3A to 3F, a first surface control layer 200 is formed on the substrate 100, and a second surface control layer 300 having a higher etch resistance than the first surface control layer 200 is formed in the first surface control layer 200 (FIG. 3A).

A first control pattern 310 is formed in the second surface control layer 300 through an exposure process. Continuously or subsequently to the formation of the first control pattern 310 in the second surface control layer 300, a second control pattern 210 having an extension cut form extending from the first control pattern 310 is formed in the first surface control layer 200. With the use of the second control pattern 210 formed in the first control layer 200, a surface control region 110 is secured on the substrate 100 (FIGS. 3A and 3C).

The second surface control layer 300 provided with the first control pattern 310 and the first surface control layer 200 provided with the second control pattern 210 are used as masks to form a primary etched pattern 430 in the surface control region 100 of the substrate 100 (FIG. 3D).

The second surface control layer 300 provided with the first control pattern 310 is removed (FIG. 3E), and the first surface control layer 200 provided with the second control pattern 210 is used as a mask to form a secondary etched pattern 430 in the surface control region 100 (FIG. 3F).

With the use of the first surface control layer 200 provided with the second control pattern 210 as a mask, the first quantum dot structure 411 is formed in the surface control region including the primary etched pattern and the secondary etched pattern [(FIG. 3G) illustrating a case where the first quantum dot structure 411 is made of a single metal, and (FIG. 3I) illustrating a case where the first quantum dot structure 411 is made of two or more metals].

Next, all of the surface control layers are removed to form the first quantum dot structure 411 in the surface control region 110 of the substrate 100 (FIGS. 3H and 3J).

In one embodiment illustrated in FIGS. 4A to 4H, a first surface control layer 200 is formed on the substrate 100, and a second surface control layer 300 having a higher etch resistance than the first surface control layer 200 is formed in the first surface control layer 200 (FIG. 4A).

A first control pattern 310 is formed in the second surface control layer 300 through an exposure process. Continuously or subsequently to the formation of the first control pattern 310 in the second surface control layer 300, a second control pattern 210 having an extension cut form extending from the first control pattern 310 is formed in the first surface control layer 200. With the use of the second control pattern 210 formed in the first control layer 200, a surface control region 110 is secured on the substrate 100 (FIGS. 4B and 4C).

With the use of the second surface control layer 300 provided with the first control pattern 310 and the first surface control layer 200 provided with the second control pattern 210 as masks, a thin film structure 420 is formed in the surface control region 110 (FIG. 4D).

In addition, the second surface control layer 300 provided with the first control pattern 310 is removed (FIG. 4E), and the second quantum dot structure 412 is formed to be superimposed on the thin film layer formed in the first surface control region 110 with the use of the first surface control layer 200 provided with the second control pattern 210 as a mask [(FIG. 4F) illustrating a case where the second quantum dot structure 412 is made of a single metal, and (FIG. 4H) illustrating a case where the second quantum dot structure 412 is made of two or more metals].

Next, the first surface control layer 200 provided with the second control pattern 210 is removed to form a composite quantum dot structure composed of the second quantum dot structure 412 and the thin film structure 420 in the surface control region 110 of the substrate 100 (FIGS. 4G and 4I).

In one embodiment illustrated in FIGS. 5A to 5J, a first surface control layer 200 is formed on the substrate 100, and a second surface control layer 300 having a higher etch resistance than the first surface control layer 200 is formed in the first surface control layer 200 (FIG. 5A).

A first control pattern 310 is formed in the second surface control layer 300 through an exposure process. Continuously or subsequently to the formation of the first control pattern 310 in the second surface control layer 300, a second control pattern 210 having an extension cut form extending from the first control pattern 310 is formed in the first surface control layer 200. With the use of the second control pattern 210 formed in the first control layer 200, a surface control region 110 is secured on the substrate 100 (FIGS. 5B and 5C).

The second surface control layer 300 provided with the first control pattern 310 and the first surface control layer 200 provided with the second control pattern 210 are used as masks to form an etched pattern 430 in the surface control region 100 (FIG. 5D).

With the use of the second surface control layer 300 provided with the first control pattern 310 and the first surface control layer 200 provided with the second control pattern 210 as masks, a thin film structure 420 is formed in a multilayer thin film form in the surface control region 110 (FIG. 5E).

In addition, the second surface control layer 300 provided with the first control pattern 310 is removed (FIG. 5E), and the second quantum dot structure 412 is formed to be superimposed on the thin film structure 420 formed in the first surface control region 110 including the etched pattern 430 with the use of the first surface control layer 200 provided with the second control pattern 210 as a mask (FIG. 5G illustrating a case where the second quantum dot structure 412 is made of a single metal, and FIG. 5I illustrating a case where the second quantum dot structure 412 is made of two or more metals].

Next, the first surface control layer 200 provided with the second control pattern 210 is removed to form a composite quantum dot structure composed of the second quantum dot structure 420 and the thin film structure 412 in the surface control region 110 including the etched pattern 430 on the substrate 100 (FIGS. 5H and 5J).

In one embodiment illustrated in FIGS. 6A to 6J, a first surface control layer 200 is formed on the substrate 100, and a second surface control layer 300 having a higher etch resistance than the first surface control layer 200 is formed in the first surface control layer 200 (FIG. 6A).

A first control pattern 310 is formed in the second surface control layer 300 through an exposure process. Continuously or subsequently to the formation of the first control pattern 310 in the second surface control layer 300, a second control pattern 210 having an extension cut form extending from the first control pattern 310 is formed in the first surface control layer 200. With the use of the second control pattern 210 formed in the first control layer 200, a surface control region 110 is secured on the substrate 100 (FIGS. 6B and 6C).

The second surface control layer 300 provided with the first control pattern 310 and the first surface control layer 200 provided with the second control pattern 210 are used as masks to form an etched pattern 430 in the surface control region 100 (FIG. 6D).

With the use of the second surface control layer 300 provided with the first control pattern 310 and the first surface control layer 200 provided with the second control pattern 210 as masks, a thin film structure 420 is formed in the etched pattern 430 of the surface control region 110 (FIG. 6E). Here, the thin film structure 420 is formed to be inclined in the etched pattern 430 by using a tilt evaporation process.

In addition, the second surface control layer 300 provided with the first control pattern 310 is removed (FIG. 6E), and the second quantum dot structure 412 is formed to be superimposed on the thin film structure 420 formed in the first surface control region 110 including the etched pattern 430 with the use of the first surface control layer 200 provided with the second control pattern 210 as a mask (FIG. 6G illustrating a case where the second quantum dot structure 412 is made of a single metal, and FIG. 6I illustrating a case where the second quantum dot structure 412 is made of two or more metals].

Next, the first surface control layer 200 provided with the second control pattern 210 is removed to form a composite quantum dot structure composed of the second quantum dot structure 412 and the thin film structure 420 in the surface control region 110 including the etched pattern 430 in which the inclined thin film structure 412 is formed (FIGS. 6H and 6J).

Herein below, data of the results of the process of the present invention will be described in detail with reference to the accompanying drawings.

According to one embodiment of the present invention, when a substrate was a semiconductor laminate of an LED, the substrate was a red LED epi-wafer (p-AlGaInP/u-Al-GaInP/MQW (AlGaInP/InGaP)/u-AlGaInP/n+GaAs/n-Al-GaInP/GaAs substrate). On the red LED epi-wafer, a second surface control layer (AZ GXR-601 resist) provided with a first control pattern and a first surface control layer (lift-off resist (LOR)) provided with a second control pattern were formed.

More specifically, hexamethyldisilazane (HMDS) [AZ AD Promoter-K, AZ Electronic Materials, Luxembourg] was applied by spin coating on a red LED epi-wafer at 2000 rpm for 40 seconds and then dried at 100° C. for 120 seconds, and LOR 20B [MicroChem Corp., Japan] was applied by spin coating at 4000 rpm for 40 seconds and then dried at 170° C. for 300 seconds to form a 2 μm-thick first surface control layer. AZ GXR-601 resist was applied by spin coating on the first surface control layer at 4500 rpm for 40 seconds and then dried at 90° C. for 90 seconds to form a 2 μm-thick AZ GXR-601 resist layer as a second surface control layer.

After locally irradiating with 60 mJ/cm2 of ultraviolet light using a photomask and drying at 110° C. for 90 seconds using a post exposure bask (PEB) process, the substrate was dipped in AZ 300 MIF [AZ Electronic Materials, Luxembourg], which is a development solution for 20 seconds. Then, the substrate was rinsed with deionized (DI) water, and N2 blowing was performed on the substrate. The result the processes is shown FIG. 7A.

Figure 7B:
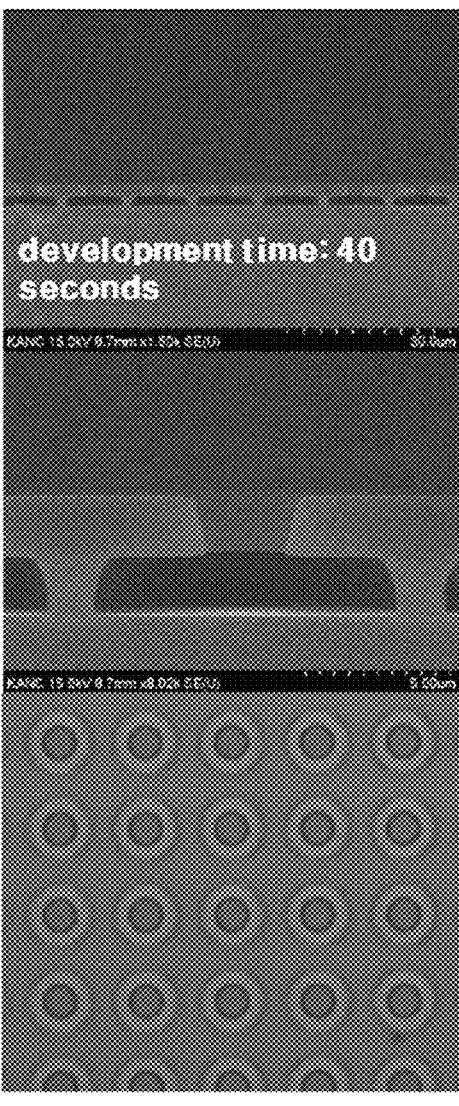
FIGS. 7B, 7C, and 7D are views illustrating SEM images and optical images of a second surface control layer having a first control pattern and a first surface control layer having a second control pattern, according to one embodiment of the present invention.
Figure 7C:
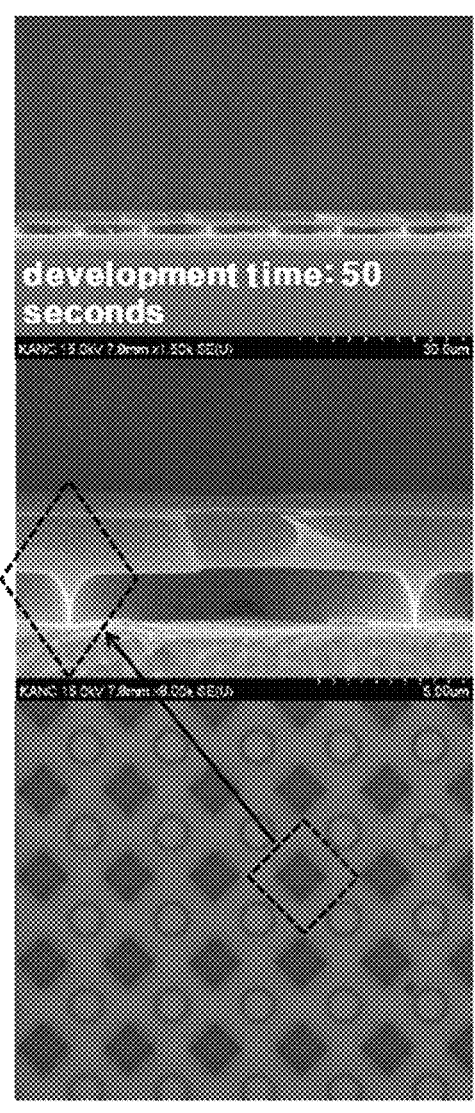
Figure 7D:
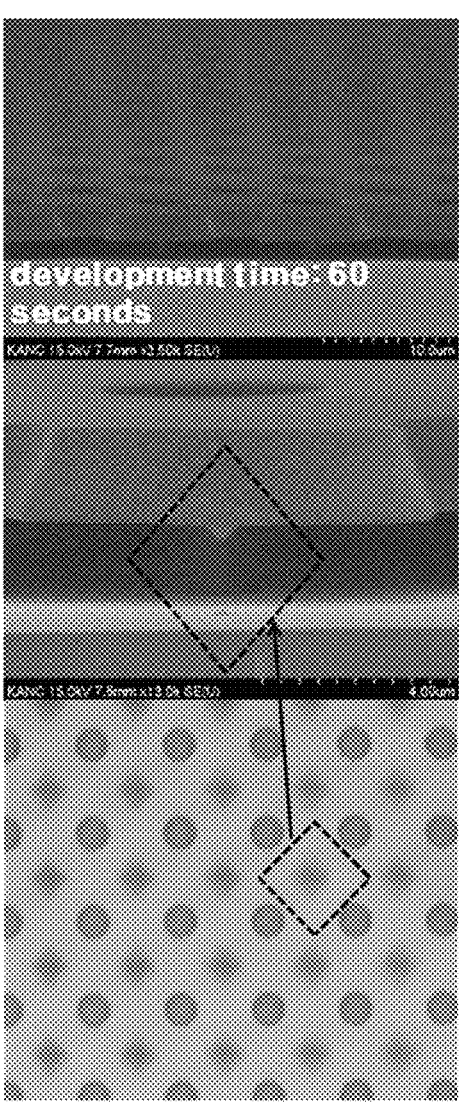
Figures 8A, 8B:
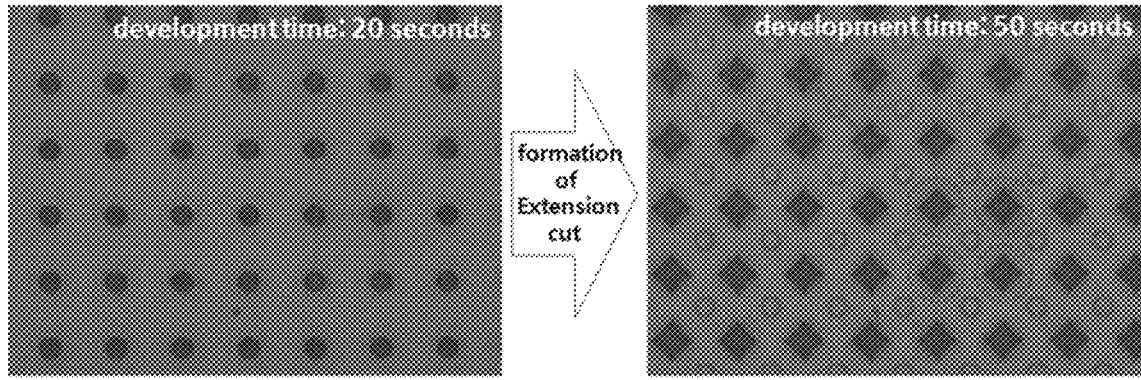
Figure 8C:
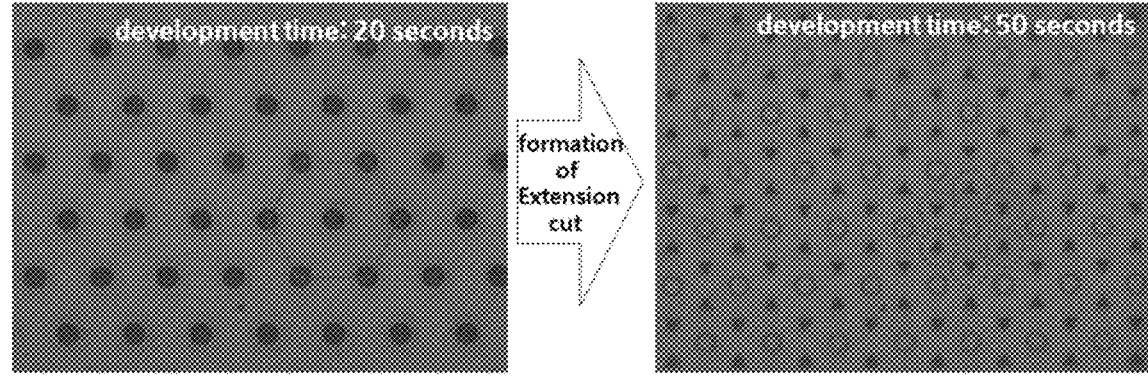

In the case of FIGS. 7B, 7C, and 7D, as a result of excessively performing the development process. FIGS. 7B, 7C, and 7D correspond to the cases where DI water rinsing was performed after the substrate was dipped in the development solution for 40 seconds, 50 seconds, and 60 seconds, respectively.

That is, FIG. 7A illustrates an optical image and an SEM analysis resist for a second surface control layer provided with a first control pattern and a first surface control layer provided with a second control pattern (undercut), according to a conventional art. FIGS. 7B, 7C, and 7D are optical images and SEM images of a second surface control layer provided with a first control pattern and a first surface control layer provided with a second control pattern (extension cut), according to one embodiment of the present invention.

As illustrated in FIGS. 7B, 7C, and 7D, to be matched with the first control patterns of the second surface control layer, the second control patterns of the first surface control layer are formed as extension cuts having various shapes and areas in the first surface control layer. The second control patterns serve as surface control regions on the surface.

Figures 8E, 8F:
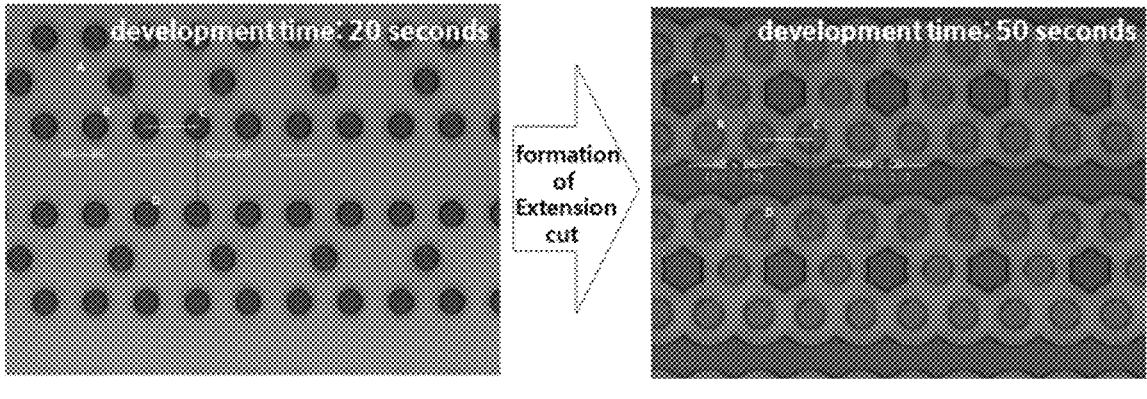
Figure 9A:
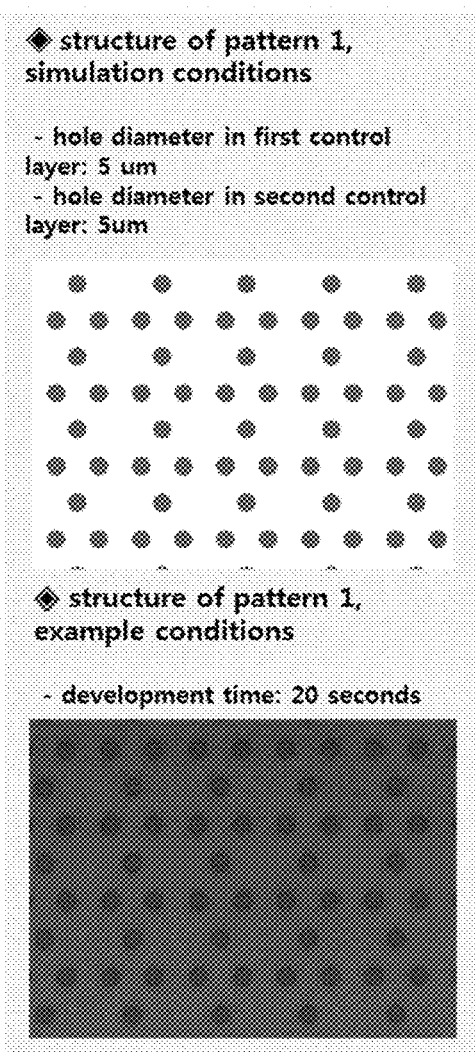
Figure 9B:
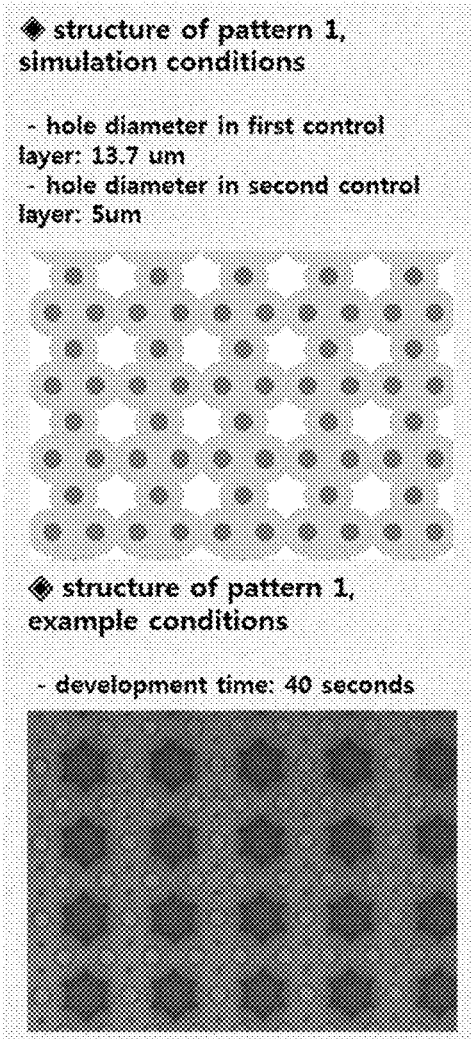
Figure 9E:
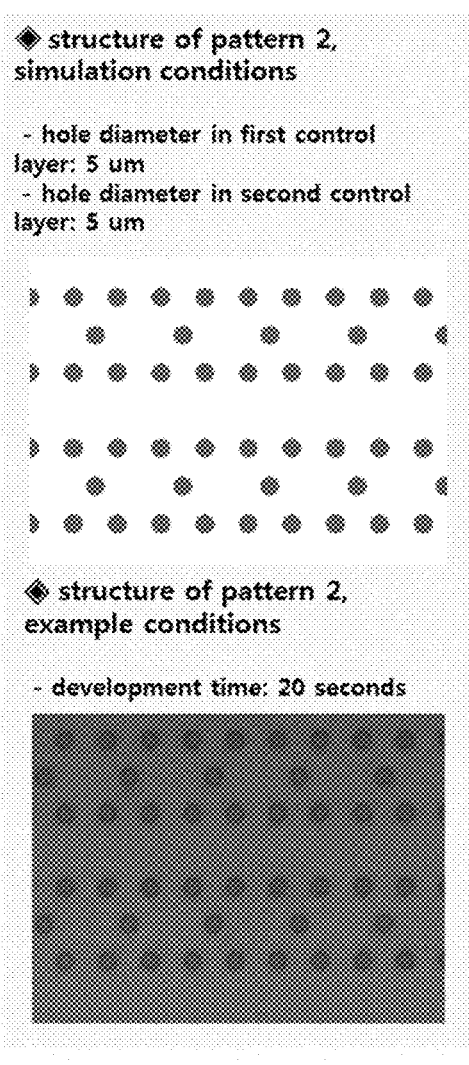
Figure 9H:
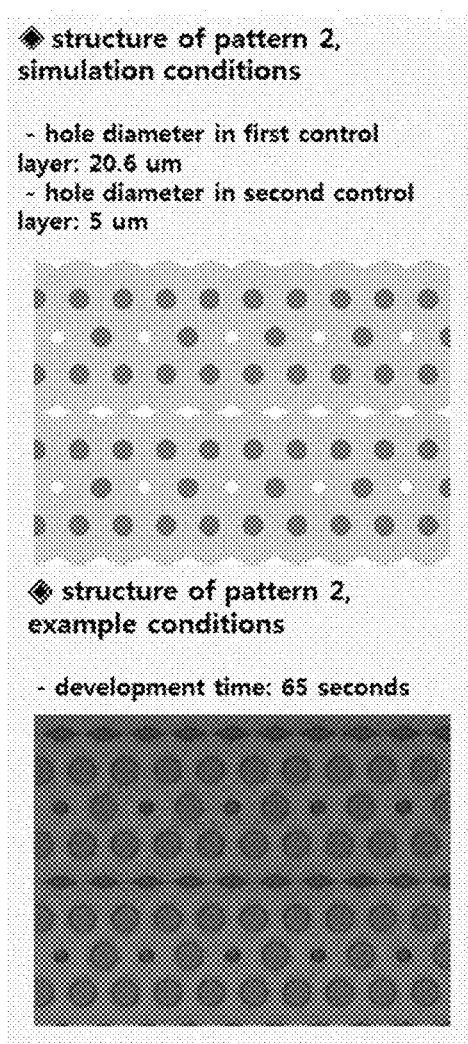

The same process as in the exemplary embodiment illustrated in FIGS. 7A TO 7D was performed. In the case of FIGS. 8A, 8C, 8E, the development time was set to 20 seconds. In the case of FIGS. 8B, 8D, and 8F, the development time was set to 50 seconds to form extension cuts.

When the extension cuts are formed, a new pattern (second control pattern) could be formed in the first surface control layer due to the first control patterns of the second surface control layer, and it was confirmed that the arrangement of the second control patterns newly formed in the first surface control layer were adjustable by the adjustment of the first control patterns formed in the second surface control layer.

That is, in FIG. 8A, a square array (holes are arranged in the form of a four-sided square array) is illustrated. When extension cuts are formed, the second control patterns of the first surface control layer are also arranged in a square array (a four-sided square array of new patterns [FIG. 8 B]).

In addition, in FIG. 8C, a hexagonal array (hexagonal array having a six-sided pattern) is formed. When extension cuts are formed, the arrangement of the newly formed second control patterns of the first surface control layer also becomes a hexagonal array (a six-sided pattern [FIG. 8D].

That is, in accordance with the arrangement of the first control patterns of the second surface control layer, according to the present embodiment, the second control patterns of the first surface control layer are also formed to be arranged in the same polygonal shape.

As illustrated in FIG. 8E, when the distance between A and B is equal to the distance between B and C, the patterns can be connected to each other when extension cuts are formed [FIG. 8F]. When the distance between B and C is not equal to the distance between C and D, due to the space between C and D, the patterns can be separated from each other [FIG. 8F].

FIG. 9 is a comparison view for simulation results representing various surface control regions and actual extension cuts on a substrate for volume adjustment of extension cuts, according to one embodiment of the present invention.

That is, the hole diameter of the second surface control layer is fixed to 5 μm, and extension cuts having control regions having various shapes and various surface areas are shown. That is, it was confirmed that the control was performed such that the simulation results of the pattern structures and the experimental results of the examples were consistent with each other.

According to one embodiment of the present invention, as the substrate, a bare glass wafer was used. After forming a surface control region in the same manner as illustrated in FIG. 7B, quantum dot inks for displaying green light and red light were added in a dispensing manner and then dried at 60° C. for 3 minutes by convection. Thereafter, the AZ GXR-601 resist, which is the second surface control layer, was removed, and the LOR, which is the first surface control layer, was then removed.

The optical microscope measurement results are shown in FIGS. 10A and 10B. FIGS. 10C and 10D illustrate PL measurement results of green and red quantum dots that were patterned.

Referring to FIG. 10C, the center wavelength of the measurement peak was 530 nm, and thus green light was emitted. Referring to FIG. 10D, the center wavelength of the PL peak was 627 nm, and red light was emitted.

FIG. 11 is an optical image and PL changes of a structure including green quantum dot ink and red quantum dot ink according to a change in concentration of green quantum dot ink and red quantum dot ink after an etched pattern is formed in a surface control region according to an embodiment of the present invention. FIG. 11 illustrates an embodiment regarding PL control of mixed light of two kinds of light including blue light emitted from the MQW of a blue LED epi-layer and green or red light emitted from a green or red quantum dot.

When the substrate is a semiconductor laminate of an LED, the substrate is a blue LED epi-wafer [p-GaN/MQW (InGaN/GaN)/n-GaN/un-GaN/sapphire substrate]. On the blue LED epi-wafer, a second surface control layer (AZ GXR-601 resist) provided with a first control pattern and a first surface control layer (lift-off resist (LOR)) provided with a second control pattern were formed.

More specifically, hexamethyldisilazane (HMDS) [AZ AD Promoter-K, AZ Electronic Materials, Luxembourg] was applied by spin coating on the blue LED epi-wafer at 2000 rpm for 40 seconds and then dried at 100° C. for 120 seconds, and LOR 20B [MicroChem Corp., Japan] was applied by spin coating at 4000 rpm for 40 seconds and then dried at 170° C. for 300 seconds to form a 2 μm-thick first surface control layer. The AZ GXR-601 resist was applied by spin coating on the first surface control layer (LOR) at 4500 rpm for 40 seconds and then dried at 90° C. for 90 seconds to form a 2 μm-thick AZ GXR-601 resist layer as a second surface control layer.

After locally irradiating with 60 mJ/cm2 of ultraviolet light using a photomask (with a hole size of 4 μm and a pitch of 8 μm) and drying at 110° C. for 90 seconds using a post exposure bask (PEB) process, the substrate was dipped in AZ 300 MIF [AZ Electronic Materials, Luxembourg], which is a development solution, for 40 seconds. Then, the substrate was rinsed with deionized (DI) water, and N2 blowing was performed on the substrate.

After performing dry etching for 45 seconds with an ICP etcher [Multiplex ICP, STS, America], the second surface control layer provided with the first control pattern was removed, and the dry etching was additionally performed for 45 seconds. The green quantum dot ink was dispensed by varying the green quantum dot concentration [FIG. 11A for green quantum dot concentration A (20 mg/ml), FIG. 11B for green quantum dot concentration B (50 mg/ml), and FIG. 11C for green quantum dot concentration C (100 mg/ml)], and dried at 60° C. for 3 minutes using a convection oven. After that, the first surface control layer was removed. The optical microscope measurement results and PL measurement results thereof are shown in FIGS. 11A, 11B, 11C, 11C, 11E, and 11F.

That is, it was confirmed that the PL was adjustable according to changes in thickness and shape of a three-dimensional green quantum dot formed in the surface control region according to the change in the concentration of the green quantum dot.

Figure 11B:
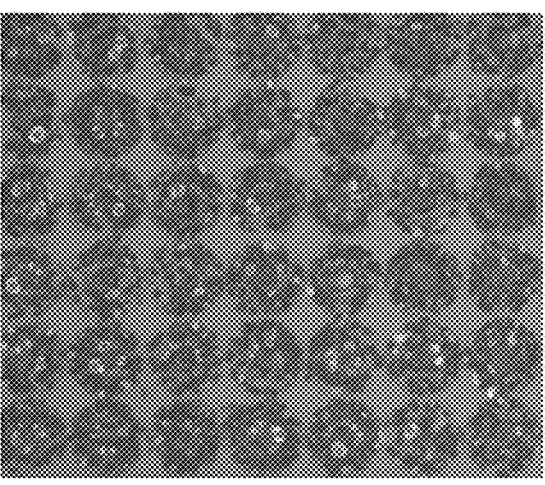
Figure 11C:
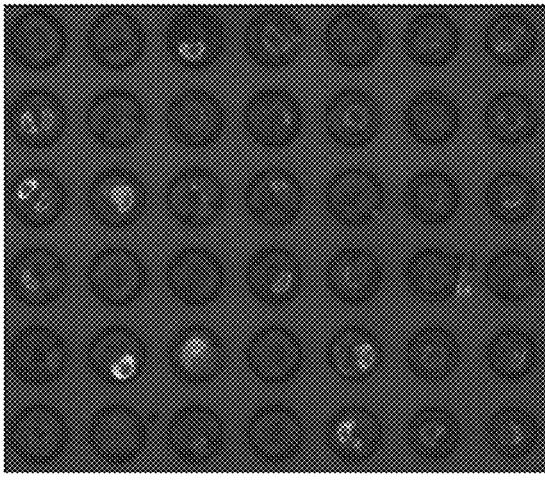
Figure 11H:
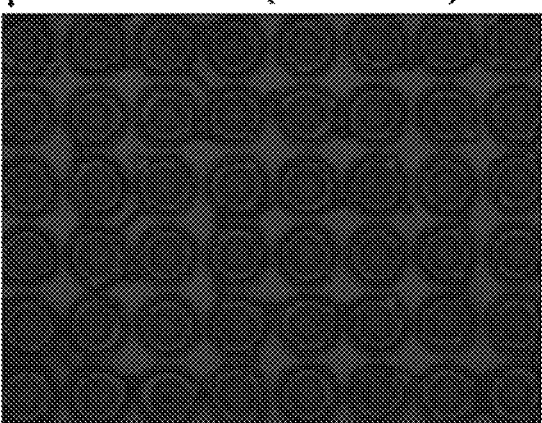
Figure 11I:
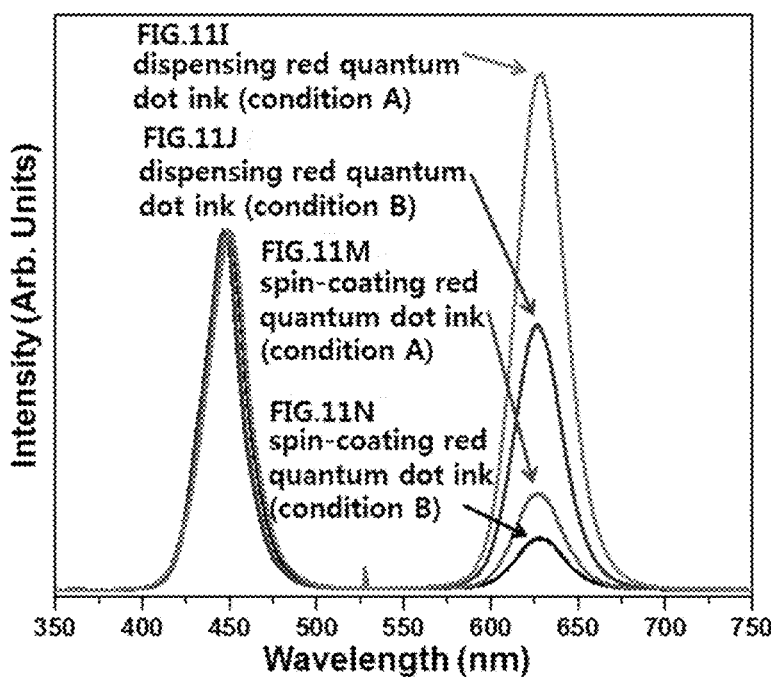
Figure 12A:
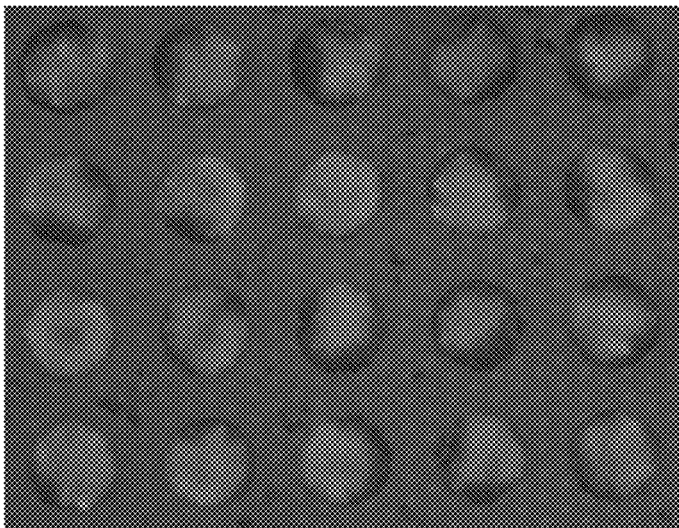
Figure 12B:
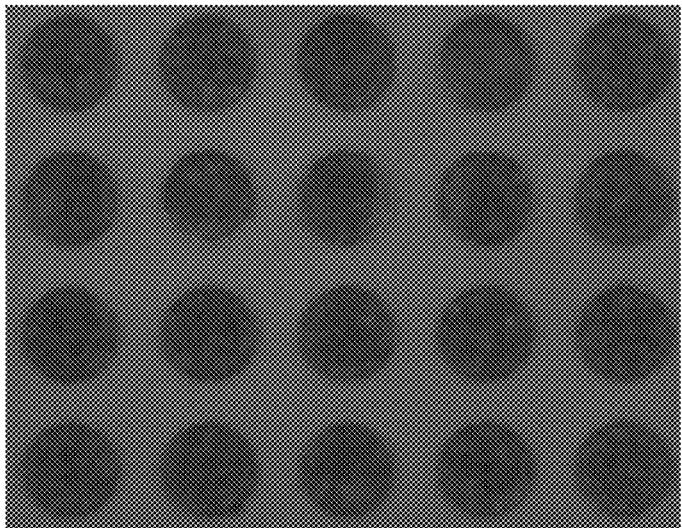

FIGS. 11G, 11H, 11I, and 11J illustrate the experimental results for PL adjustment depending on changes in the shape and thickness of a three-dimensional red quantum dot formed in the surface control region according to changes in a dispensing quantity for the red quantum dot on the surface control region after the secondary dry etching process [FIG. 11G: dispensing condition A (quantity of dropping for a red quantum dot is 100 μl, FIG. 11H: dispensing condition B (quantity of dropping for a red quantum dot is 50 μl)]

That is, it was confirmed that the PL was adjustable according to the changes in thickness and shape of a three-dimensional red quantum dot formed in the surface control region according to the change in the quantity of dropping for a red quantum dot.

Figure 11K:
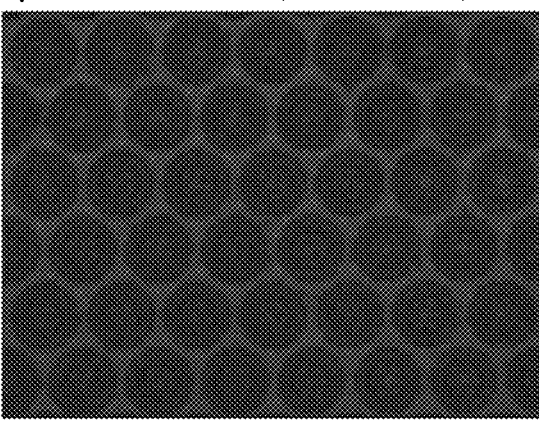
Figure 11L:
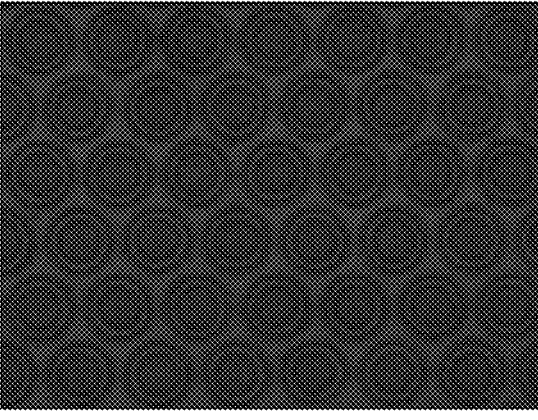

FIGS. 11K, 11L, 11M, and 11N illustrate the experimental results for PL adjustment according to the changes in shape and thickness of three-dimensional red quantum dots formed in the surface control regions according to changes in spin coating conditions [FIG. 11K: spin-coating condition A (1000 rpm), FIG. 11L: spin-coating condition B (3000 rpm)] for forming the red quantum dots in the surface control regions after the secondary dry etching process.

That is, it was confirmed that the PL was adjustable according to the changes in thickness and shape of three-dimensional red quantum dots formed in the surface control regions according to the changes in spin coating conditions for the red quantum dots.

FIG. 12 is a view illustrating an embodiment regarding mixed light of three kinds of light including blue light emitted from the MQW of the blue LED epi-layer, and green light and red light emitted from the green quantum dot and the red quantum dot.

According to one embodiment of the present invention, after forming a three-dimensional etched structure is formed in a surface control region, a mixing ratio of inks for a green quantum dot and a red quantum dot was adjusted, the number of mixed ink drops and the mixing ratio of inks were varied, and the thickness was varied. In this way, PL was adjusted for each of red, green, and blue quantum dots for implementation of full color RGB.

FIG. 12A relates to a case where a green quantum dot ink and a red quantum dot ink were mixed in a wt. % ratio of 1:9 to prepare a mixed ink and FIG. 12B relates to a case where the green quantum dot ink and the red quantum dot ink were mixed in a wt. % ratio of 4:6 to prepare a mixed ink. After the preparation of the mixed inks, each of the mixed inks was dispensed in the three-dimensional etched surface control region on the substrate in the same manner as illustrated in FIG. 11 and dried at 60° C. for 3 minutes in a convection oven, and the first surface control layer was removed. The optical microscopy results of the prepared substrates are illustrated in FIGS. 12A and 12B.

That is, it was confirmed that it was possible to form a composite quantum dot structure in a predetermined position using a mixed ink of a green quantum dot ink and a red quantum dot ink.

FIGS. 12C and 12D illustrate PL measurements of composite quantum dot structures formed in predetermined positions by using mixed inks in which the green quantum dot ink and the red quantum dot ink are mixed at a wt. % mixing ratio of 1:9 and a wt. % mixing ratio 4:6, respectively. In the case of the mixed ink [FIG. 12C] in which the content of the red quantum dot ink is higher, the PL peak intensity of red light was higher than the PL peak intensity of green light. In the case of the mixed ink [FIG. 12D] in which the mixing ratio of the green quantum dot ink and the red quantum dot ink was 4:6, the PL peak intensity of red light was higher than the PL peak intensity of green light. That is, in the case of using a quantum dot mixed ink, by adjusting the mixing ratio of inks for different types of quantum dots for a mixed ink quantum dot, the intensity of each type of light emitted from the quantum dot can be adjusted.

FIGS. 12E to 12G illustrate the results of PL measurements. FIG. 12E relates to a case where a mixed ink in which a green quantum dot ink and a red quantum dot ink are mixed in a wt. % ratio of 4:6 is dispensed in the three-dimensional etched surface control region of the substrate in the same manner as illustrated in FIG. 11, dried at 60° C. for 90 seconds in a convention oven, and the first surface control layer is removed. The PL measurement result of FIG. 12F relates to a case where the first surface control layer is not removed unlike the case of FIG. 12E, the mixed ink is dispensed again and dried at 60° C. for 90 seconds in a convention oven, and then the first surface control layer is removed. FIG. 12G illustrates a PL measurement result of a composite quantum dot structure formed in a predetermined position by performing the same process as illustrated in FIG. 12F four times.

FIG. 12H illustrates a PL measurement result of a structure formed in the same manner as the method related to FIG. 12E, except that the mixed ink is applied by spin coating. The applied ink was dried at 60° C. for 90 seconds in a convection oven, and then the first surface control layer was removed.

Referring to the PL measurements of FIGS. 12E to 12H, when a composite quantum dot structure is formed at a specific position in a three-dimensional etched surface control region, the PL of green quantum dots and the PL of red quantum dots can be increased or decreased at similar ratios by adjusting the number of repetitions of the dot formation and the thickness of the composite quantum dot structure.

The invention claimed is:

1. A surface-controlled substrate provided with a structure including quantum dots, the surface-controlled substrate comprising:
   a substrate in which a surface control region is secured by multiple surface control layers each being provided with a control pattern; and
   the structure including quantum dots formed in the surface control region on the substrate by using the multiple surface control layers, each being provided with the control pattern, as a mask.

2. The surface-controlled substrate of claim 1, wherein the structure including quantum dots is formed as a single first quantum dot structure by removing all of the surface control layers after the structure is formed, or
   the structure including quantum dots is formed as a composite quantum dot structure that is obtained by forming the first quantum dot structure in the surface control region of the substrate while using the multiple surface control layers provided with the control patterns as masks, sequentially removing the surface control layers, and forming a quantum dot structure different from the first quantum dot structure in a manner to be superimposed on the quantum dot structure in a portion of the substrate by using the remaining surface control layers as masks, or
   the structure including quantum dots is formed as a structure in which the first quantum dot structure or the composite quantum dot stricture is superimposed on a thin film structure, by forming the thin film structure in the surface control region of the substrate while using the multiple surface control layers provided with the control patterns as masks, sequentially removing the surface control layers, and forming the first quantum dot structure or the composite quantum dot structure in a portion of the substrate while using the remaining surface control layer as a mask.

3. The surface-controlled substrate of claim 1, wherein the multiple surface control layers differ in etch resistance from each other.

4. The surface-controlled substrate of claim 1, wherein the quantum dot is made of any one material or a combination of two more materials selected from the group consisting of CdS, CdSe, CdTe, ZnS, ZnSe, ZnTe, CuInS$_2$, HgS, HgSe, HgTe, CdSeS, CdSeTe, CdSTe, PbSe, PbS, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, CdZnSeS, CdZnSeTe, CdZnSTe, CdHgSeS, CdHgSeTe, CdHgSTe, HgZnSeS, HgZnSeTe, HgZnSTe, GaN, GaP, GaAs, AlN, AlP, AlAs, InN, InP, InAs, GaNP, GaNAs, GaPAs, AlNP, AlNAs, AlPAS, InNP, InNAs, InPAs, GaAlNP, GaAlNAs, GaAlPAs, GaInNP, GaInNAs, GaIn-PAs, InAlNP, InAlNAs, and InAlPAs.

5. The surface-controlled substrate of claim 1, wherein an etched pattern is formed in the surface control region of the substrate by using the multiple surface control layers as etch masks.

6. The surface-controlled substrate of claim 5, wherein the structure including quantum dots is formed to correspond to the etched pattern.

7. The surface-controlled substrate of claim 2, further comprising a protective layer to protect one or more of the first quantum dot structure and the composite quantum dot structure.

8. The surface-controlled substrate of claim 1, wherein the substrate is an n-type semiconductor layer or a p-type semiconductor layer formed as a top layer of a photoelectronic element.

9. A photoelectronic element comprising the surface-controlled substrate provided with the structure including quantum dots according to claim 1.

10. The photoelectronic element of claim 9, wherein the photoelectronic element is any one device selected from among a light-emitting diode (LED), a micro-LED, a solar cell, a laser diode (LD), a photodiode (PD), and an avalanche photo diodes (APD).

\* \* \* \* \*